(12) United States Patent
Tien et al.

(10) Patent No.: US 12,199,037 B2
(45) Date of Patent: Jan. 14, 2025

(54) STANDARD AND ENGINEERING CHANGE ORDER (ECO) CELL REGIONS AND SEMICONDUCTOR DEVICE INCLUDING THE SAME

(71) Applicant: TAIWAN SEMICONDUCTOR MANUFACTURING COMPANY, LTD., Hsinchu (TW)

(72) Inventors: Li-Chun Tien, Hsinchu (TW); Shun Li Chen, Hsinchu (TW); Ting-Wei Chiang, Hsinchu (TW); Ting Yu Chen, Hsinchu (TW); XinYong Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/362,824

(22) Filed: Jul. 31, 2023

(65) Prior Publication Data

US 2023/0377964 A1    Nov. 23, 2023

Related U.S. Application Data

(60) Continuation of application No. 17/332,819, filed on May 27, 2021, now Pat. No. 11,817,350, which is a
(Continued)

(51) Int. Cl.
*H01L 23/528*    (2006.01)
*G06F 30/30*    (2020.01)
(Continued)

(52) U.S. Cl.
CPC ............ *H01L 23/528* (2013.01); *G06F 30/30* (2020.01); *G06F 30/392* (2020.01);
(Continued)

(58) Field of Classification Search
CPC ............... H01L 23/528; H01L 23/5226; H01L 27/0207; H01L 27/11807; G06F 30/392; G06F 30/398; G06F 30/394; G06F 30/30
See application file for complete search history.

(56) References Cited

U.S. PATENT DOCUMENTS 8,159,013 B2    4/2012    Nishimura et al.
8,421,205 B2    4/2013    Yang
(Continued)

FOREIGN PATENT DOCUMENTS

JP    2010-16258    1/2010
KR    10-2016-0031401    3/2016

OTHER PUBLICATIONS

Office Action dated Aug. 14, 2018 from corresponding application No. KR 10-2017-0124253.
(Continued)

*Primary Examiner* — Michael Jung
(74) *Attorney, Agent, or Firm* — Hauptman Ham, LLP

(57) ABSTRACT

A method of manufacturing an ECO base cell includes forming first and second active areas on opposite sides of, and having corresponding long axes arranged parallel to, a first axis of symmetry; forming non-overlapping first, second and third conductive structures having long axes in a second direction perpendicular to the first direction and parallel to a second axis of symmetry, each of the first, second and third conductive structures to correspondingly overlap the first and second active areas, the first conductive structure being between the second and third conductive structures; removing material from central regions of the second and third conductive structures; and forming a fourth conductive structure being over the central regions of the second and third conductive structures and occupying an area which substantially overlaps a first segment of the first
(Continued)

conductive structure and a first segment of one of the second and third conductive structures.

20 Claims, 29 Drawing Sheets

Related U.S. Application Data continuation of application No. 16/791,906, filed on Feb. 14, 2020, now Pat. No. 11,030,373, which is a continuation of application No. 16/206,881, filed on Nov. 30, 2018, now Pat. No. 10,565,345, which is a division of application No. 15/474,460, filed on Mar. 30, 2017, now Pat. No. 10,339,250.

(60) Provisional application No. 62/427,609, filed on Nov. 29, 2016.

(51) Int. Cl.
*G06F 30/392* (2020.01)
*G06F 30/394* (2020.01)
*G06F 30/398* (2020.01)
*H01L 21/768* (2006.01)
*H01L 23/522* (2006.01)
*H01L 27/02* (2006.01)
*H01L 27/118* (2006.01)

(52) U.S. Cl.
CPC .......... *G06F 30/394* (2020.01); *G06F 30/398* (2020.01); *H01L 21/76895* (2013.01); *H01L 23/5226* (2013.01); *H01L 27/0207* (2013.01); *H01L 27/11807* (2013.01)

(56) References Cited

U.S. PATENT DOCUMENTS

| | | | |
|---|---|---|---|
| 8,446,176 B1 | 5/2013 | Yang | |
| 8,661,389 B2 | 2/2014 | Chern et al. | |
| 8,698,205 B2 | 4/2014 | Tzeng et al. | |
| 8,791,024 B1 | 7/2014 | Lu et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 9,640,522 B1 | 5/2017 | Sahu et al. | |
| 9,899,263 B2 | 2/2018 | Hsieh et al. | |
| 2007/0235815 A1 | 10/2007 | Kim | |
| 2009/0007051 A1 | 1/2009 | Chou et al. | |
| 2010/0164547 A1 | 7/2010 | Ciccarelli et al. | |
| 2011/0252392 A1 | 10/2011 | Saika | |
| 2012/0280287 A1* | 11/2012 | Hou | H01L 27/11807 257/773 |
| 2012/0304142 A1 | 11/2012 | Morimoto et al. | |
| 2014/0264924 A1 | 9/2014 | Yu et al. | |
| 2014/0282289 A1 | 9/2014 | Hsu et al. | |
| 2015/0015335 A1 | 1/2015 | Chen et al. | |
| 2015/0048424 A1* | 2/2015 | Tien | H01L 27/0207 438/6 |
| 2015/0140478 A1 | 5/2015 | Chen et al. | |
| 2015/0143309 A1 | 5/2015 | De Dood et al. | |
| 2015/0179648 A1 | 6/2015 | Lin et al. | |
| 2015/0263039 A1* | 9/2015 | Singh | H01L 27/11807 257/206 |
| 2015/0279453 A1 | 10/2015 | Fujiwara et al. | |
| 2015/0302135 A1 | 10/2015 | Park | |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2015/0370949 A1 | 12/2015 | Moroz | |
| 2016/0012169 A1 | 1/2016 | Chiang et al. | |
| 2016/0117431 A1 | 4/2016 | Kim et al. | |
| 2016/0283641 A1 | 9/2016 | Bou-Ghazale et al. | |
| 2016/0307882 A1 | 10/2016 | Chen et al. | |
| 2017/0004244 A1 | 1/2017 | Paik et al. | |
| 2017/0098608 A1 | 4/2017 | Jung | |
| 2017/0116366 A1 | 4/2017 | Seo | |
| 2017/0212977 A1 | 7/2017 | Bickford et al. | |
| 2017/0323030 A1 | 11/2017 | Datta et al. | |
| 2018/0090513 A1 | 3/2018 | Datta et al. | |
| 2019/0138682 A1 | 5/2019 | Correale, Jr. et al. | |

OTHER PUBLICATIONS

Office Action dated Aug. 17, 2018 from corresponding application No. TW 106134059.

Office Action dated Oct. 29, 2018 from corresponding application No. TW 106134059.

\* cited by examiner

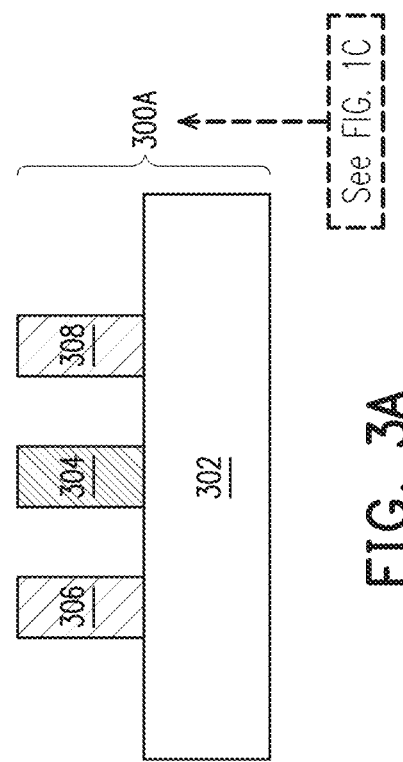
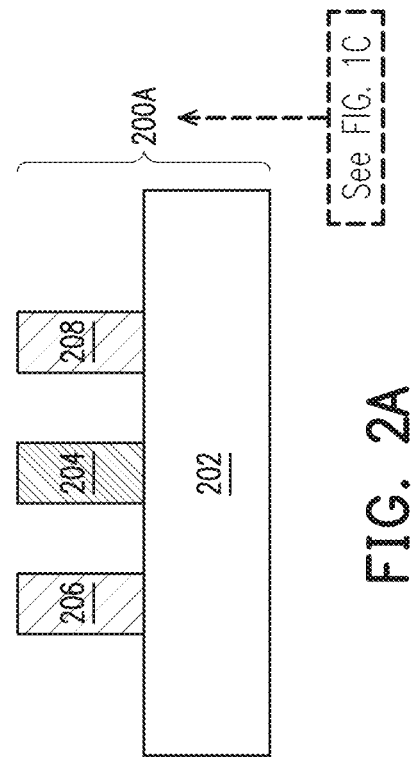

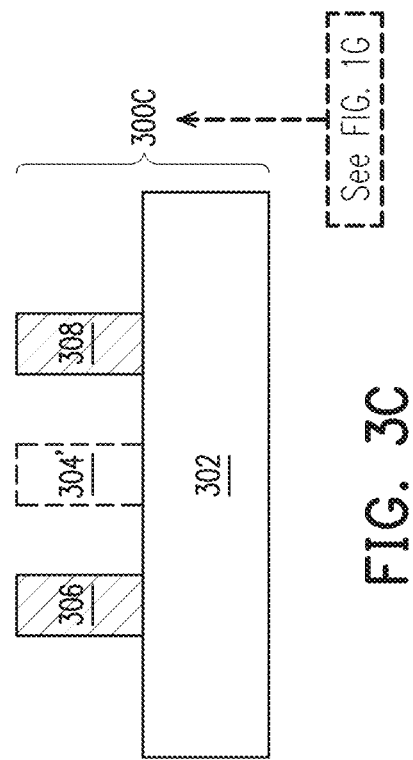
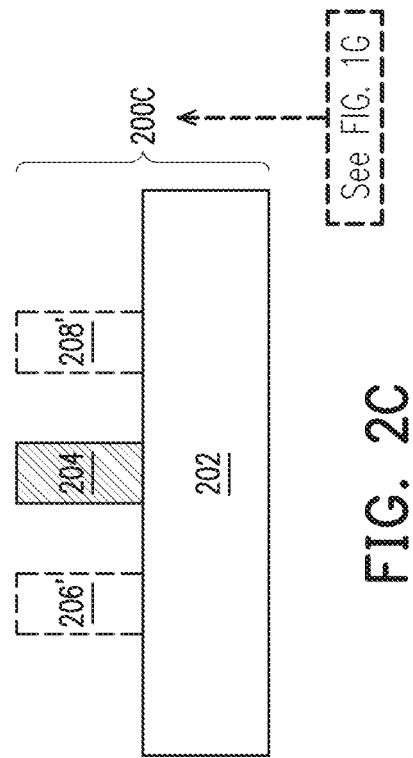

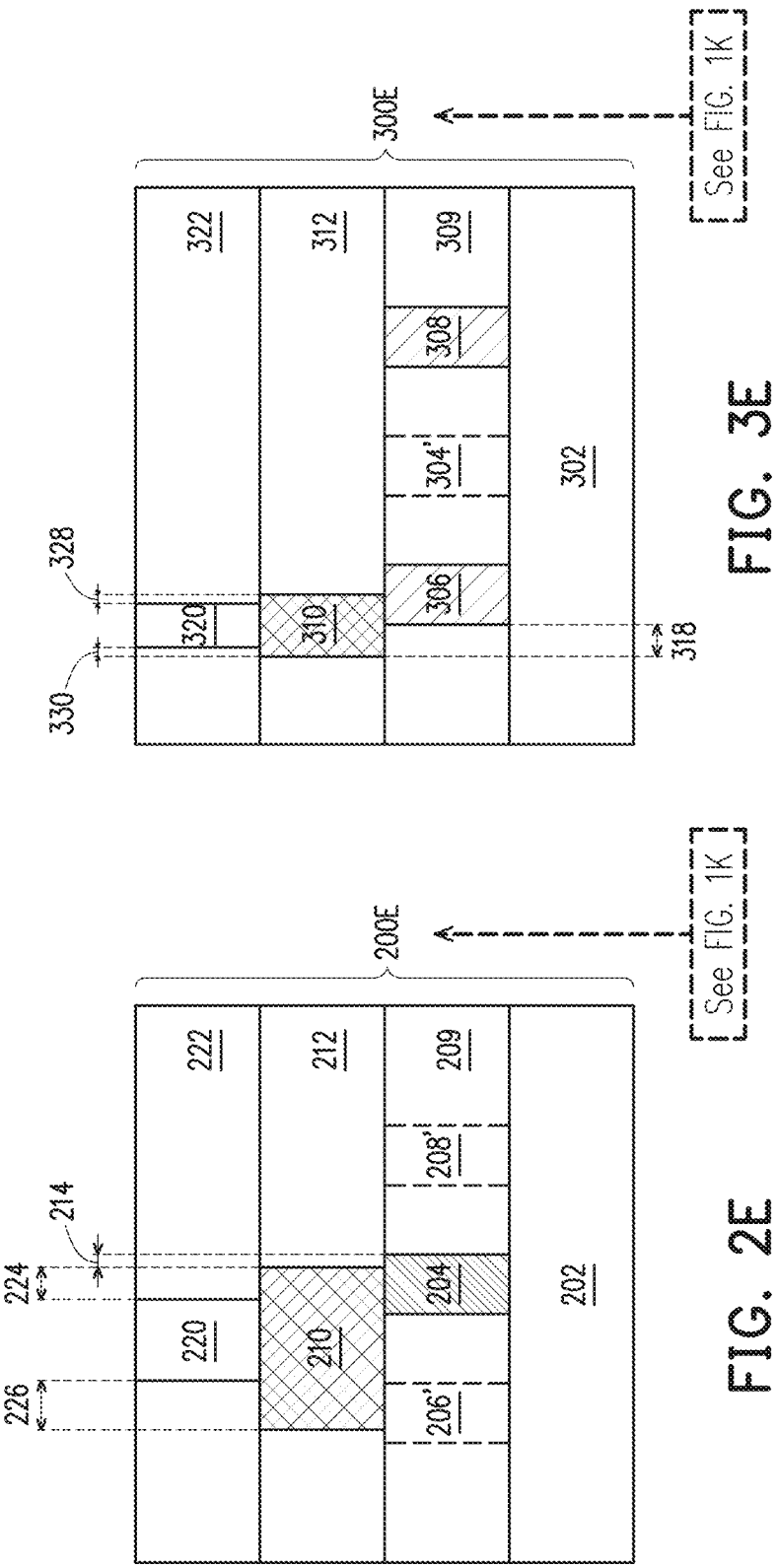

| locate the fourth conductive pattern asymmetrically about the first axis | ~660 |

FIG. 6E   600E

| generate a second cut-pattern which correspondingly overlaps a second segment of the first conductive pattern, and which is indicative that the second segment of the first conductive pattern will be removed subsequently | ~670 |

↓

| locate the second cut-pattern asymmetrically relative to the first axis, e.g., so as not to overlap the fourth conductive pattern | ~672 |

FIG. 6F   600F

STANDARD AND ENGINEERING CHANGE ORDER (ECO) CELL REGIONS AND SEMICONDUCTOR DEVICE INCLUDING THE SAME

PRIORITY CLAIM

The present application is a continuation of U.S. application Ser. No. 17/332,819, filed May 27, 2021, now U.S. Pat. No. 11,817,350, issued Nov. 14, 2023, which is a continuation of U.S. application Ser. No. 16/791,906, filed Feb. 14, 2020, now U.S. Pat. No. 11,030,373, issued Jun. 8, 2021, which is a continuation of U.S. application Ser. No. 16/206,881, filed Nov. 30, 2018, now U.S. Pat. No. 10,565,345, issued Feb. 18, 2020, which is a divisional of U.S. application Ser. No. 15/474,460, filed Mar. 30, 2017, now U.S. Pat. No. 10,339,250, issued Jul. 2, 2019, which claims the priority of U.S. Provisional Application No. 62/427,609, filed Nov. 29, 2016, which are incorporated herein by reference in their entireties.

BACKGROUND

A semiconductor device, one or more of which are included in an integrated circuit (IC), includes a number of electronic devices. One way in which to represent a semiconductor device is with a plan view diagram referred to as a layout diagram (hereinafter, layout). A layout is hierarchical and is decomposed into modules which carry out higher-level functions as required by the semiconductor device's design specifications. In some circumstances, a semi-custom design (SCD) project decomposes the modules into macro cells, standard cells and custom cells.

For a given SCD project, a custom cell is designed with an arrangement that is specific to the given SCD project in order to provide (in operation) a higher-level logic function that is specific to the SCD project. By contrast, a library of standard cells is designed with no particular project in mind and includes standard cells which provide (in operation) common, lower-level logic functions. In terms of a footprint within a layout (from the perspective of a plan view), custom cells are larger (typically much larger) than standard cells. Moreover, for a given library, all of the standard cells have at least one dimension which is the same size (typically, the size being a multiple of a library-specific fixed dimension) in order to facilitate placement of the standard cells into a layout. Typically, the direction of the fixed dimension is parallel to the vertical direction or Y-axis such that the fixed dimension is referred to as the height of the standard cell. As such, standard cells are described as being predefined with respect to a given SCD project. Custom cells may or may not have at least one dimension that is the same size as the corresponding dimension of the standard cells.

As technology improves, the density of a semiconductor device (in terms of the number of electronic devices per unit area or per unit volume) increases. One way in which to increase semiconductor device density is to reduce the size of the fixed dimension of all standard cells in a given library.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2F are cross-sections of first portions of semiconductor devices which include ECO base cells, in accordance with some embodiments.

FIGS. 3A-3F are cross-sections of second portions of the semiconductor devices which include ECO base cells, in accordance with some embodiments.

FIGS. 6A-6F are corresponding flowcharts of a method of generating a layout of an ECO base cell, in accordance with at least one embodiment.

DETAILED DESCRIPTION

Figure 1A:
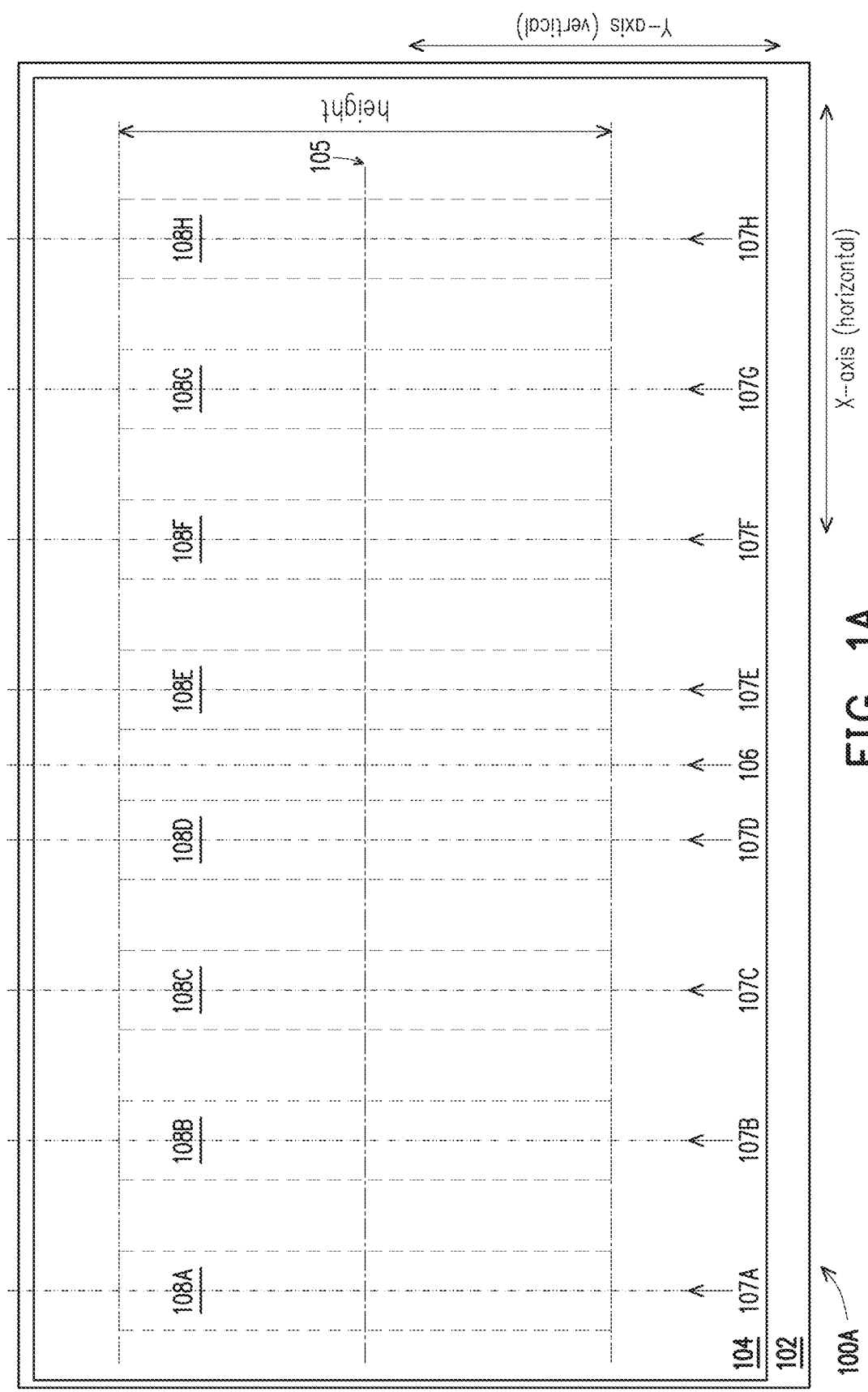
FIGS. 1A-1L are corresponding layouts of various ECO base cells for a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a layout of a standard cell typically includes: a plurality of active area patterns distributed on opposite sides of a line of symmetry (which is imaginary and typically parallel to the horizontal direction or X-axis); overlying parallel conductive structures (which serve, e.g., as gates, sources or drains of a transistor) oriented substantially perpendicularly to the line of symmetry; and an overlying metallization layer, some segments of which supply operational voltages, e.g., VDD and VSS, and are referred to as rails. Under a first metal layer, e.g., metal layer one (M(i), where i is a non-negative integer, e.g., i=0 or i=1), of a semiconductor device, a first type of inter-layer connection structure known as a metal-zero-over-poly (M0PO or MP) contact connects an underlying conductive structure, such as a gate, to a second inter-layer connection structure known as a via. The via is connected to a corresponding overlying segment of M(i).

In some embodiments, to reduce the height of standard cells, some instances of a variation of the M0PO contact are used. The variation of the M0PO contact is increased in size (from the perspective of a plan view, in the vertical and/or horizontal direction) relative to a typical instance of the M0PO contact. The variation of the M0PO contact is referred to herein as a 'tolerance contact' because the variation of the M0PO contact provides an increased tolerance (alignment-tolerance) in the degree of precision with which a given via (which overlies a given tolerance contact) is to be aligned with respect to the corresponding underlying conductive structure. A given tolerance contact is extended in size so that one or more portions of the tolerance contact extends beyond the corresponding underlying conductive structure. As a result, the location of the given via is no longer constrained by the location of the corresponding underlying conductive structure. As a further result, the given metallization segment can be proportionately reduced in size in the corresponding direction(s). Assuming that the long axes of the metallization segments are parallel to the horizontal axis, when the metallization segments are reduced in the vertical direction, the overall height of the standard cell is reduced and the density of a semiconductor device built using standard cells (which include tolerance contacts) increases.

From the perspective of a plan view, and for purposes of reducing electrical resistance, instances of the M0PO contact as well as instances of a similar type of inter-layer connection structure known as a metal-zero-over-oxide (MOOD or MD) contact are sized to fit within the footprint of the corresponding underlying conductive structures, the footprints of vias are no larger than the footprints of the tolerance contacts on which the vias are disposed, and/or vias are completely overlapped by the corresponding overlying metallization segments. Typically, the vias are shaped (from the perspective of a plan view) as squares, are sized (in the horizontal direction) to match the horizontal size of the tolerance contacts, and the horizontal size of the tolerance contacts is no larger than the horizontal size of the corresponding underlying conductive structures. Also, typically, tolerance contacts and the vias are aligned with the corresponding underlying conductive structures in the horizontal direction. Consequently, the location of a given via has been constrained by the location of the corresponding underlying conductive structure.

To facilitate complete overlap of a given via and the corresponding overlying segment in the metal layer (the "given metallization segment"), other approaches have sized the given metallization segment (in the vertical direction and/or horizontal direction) to be greater than the size (in the corresponding direction) of the given via. As a result, one or more portions of the given metallization segment extend (in the vertical and/or horizontal direction) beyond the given via. Oversizing the given metallization segment (in the vertical and/or horizontal direction) reduces the precision with which the given metallization segment must be aligned (in the corresponding direction) over the given via, which is an advantage. A disadvantage of oversizing the given metallization segment (in the vertical direction) is that the overall height (in the vertical direction) of the standard cell is increased.

Assuming that the long axes of the metallization segments are parallel to the horizontal axis, a way to reduce the overall height (in the vertical direction) of the standard cell is to reduce the vertical size of a given metallization segment. The vertical size of the given metallization segment is reduced where the location of the given via is less constrained with respect to the location of the corresponding underlying conductive structure. In some embodiments, an arrangement which makes the location of the given via less constrained accordingly can tolerate a lesser amount of oversizing of the given metallization segment. Such an arrangement increases the size (in the vertical and/or horizontal direction) of the tolerance contact which is disposed between the given via and the corresponding underlying conductive structure. Increasing the size (in the vertical and/or horizontal direction) of the tolerance contact has a benefit of making the location of the given via less constrained with respect to the location of the corresponding underlying conductive structure. The tolerance contact is increased in size (in the vertical and/or horizontal direction) so that one or more portions of the tolerance contact extend beyond the given via and similarly beyond the corresponding underlying conductive structure. As a result, the amount of oversize of the given metallization segment can be proportionately reduced in the corresponding direction(s). When the metallization segments are reduced in the vertical direction, the overall height of the standard cell is reduced and the density of a semiconductor device built using such standard cells increases. In some embodiments, the density improves by a range of about 13% to about 20%.

There are two types of standard cells, standard functional cells and standard spare cells, the latter being referred to as engineering change order (ECO) cells. Standard functional cells are defined with specific internal arrangements of components to provide (in operation) corresponding common, lower-level functions, e.g., logic functions including an inverter, NAND, NOR, XOR, D-latch, decoupling capacitor (DeCap), and-or-invert (AOI), or-and-invert (OAI), multiplexer, flip-flop, or the like.

ECO cells include ECO base cells and ECO programmed cells. An ECO programmed cell refers to an ECO base cell which has been programmed. Similar to a functional cell, an ECO base cell is defined with a specific internal arrangement of components. Unlike a functional cell, an ECO base cell is not arranged to provide a specific function. In contrast to standard cells which operate (are operational), an ECO base cell (which has not yet been programmed) does not operate (is not operational).

Recalling that ECO base cells are spare cells, the arrangement of an ECO base cell is sufficient that, if needed, the ECO base cell is able to be 'programed' (transformed) to operate and provide one of the same, common, low-level functions provided by a corresponding standard functional cell. In some embodiments, the arrangement of each ECO base cell is sufficient so that a given ECO base cell is able to be 'programed' (transformed) to operate and provide one of the logic functions including an inverter, NAND, NOR, XOR, D-latch, decoupling capacitor (DeCap), and-or-invert (AOI), or-and-invert (OAI), multiplexer, flip-flop, or the like. In some embodiments, an ECO base cell is programmed (transformed) into an ECO programmed cell by altering one or more connections within at least one ECO base cell (intra-ECO-base-cell connections) such as metal to silicon contacts and metal to polysilicon contacts, or making other metal layer changes with corresponding vias or contacts.

During an SCD project, electronic design automation (EDA) tools are used to select standard functional cells from standard cell libraries and place the standard functional cells into an initial layout along with non-standard cells (if any). EDA tools are also used to perform routing by which the standard functional cells and the non-standard cells are connected using one or more metal layers and corresponding vias and contacts. EDA tools are further used to test the routing. Depending upon the test results, the selection, placement and routing of the standard and non-standard cells is revised. In at least some embodiments, the overall selection, placement, routing and testing (SPRT) process is iterative. Eventually, the SPRT process iterations converge to a finalized layout.

For a variety of reasons (e.g., a design change, an unacceptable timing issue, an unacceptable electromigration issue, or the like), it is common for a nearly finalized layout (or a layout that otherwise would have been regarded as a final layout) to be required to undergo revision. In anticipation of circumstances in which the revision would be relatively minor in scope, and as a safeguard (or hedge) against having to restart (begin anew) the iterative SPRT process, EDA tools are also used to place one or more ECO base cells into the initial layout.

Because the ECO base cells do not operate, the ECO base cells are not connected to functional cells. When the nearly finalized layout is to be revised, one or more ECO base cells undergo 'programming,' which converts the one or more ECO base cells into one or more ECO 'programmed' cells. Then, the ECO programmed cell is routed to be operatively connected to one or more standard functional cells. In some embodiments, ECO base cells correspond to ECO base cells disclosed in U.S. Pat. No. 7,137,094, granted Nov. 14, 2006, the entirety of which is hereby incorporated by reference. In some embodiments, ECO base cells correspond to ECO base cells disclosed in U.S. Pat. No. 7,458,051, granted Nov. 25, 2008, the entirety of which is hereby incorporated by reference.

FIGS. 1A-1L are corresponding layouts 100A-100L of various ECO base cells for a semiconductor device, in accordance with some embodiments.

There are at least two types of layout diagrams. A first (or 'pre-cut') type of layout diagram represents inchoate structures and corresponding 'cut' regions. A second (or 'post-cut') type of layout diagram represents the structures resulting from the corresponding pre-cut layout diagram. Regarding the pre-cut layout diagram, an inchoate version refers to a version which is not yet completed or fully developed. A cut region indicates that a portion of a corresponding structure underlying the cut region will be removed (or cut). Here, because a portion of a given structure which underlies a corresponding cut region will be removed (or cut), the given structure is not yet completed or fully developed, and so the given structure is referred to herein as an inchoate structure.

Figure 1B:
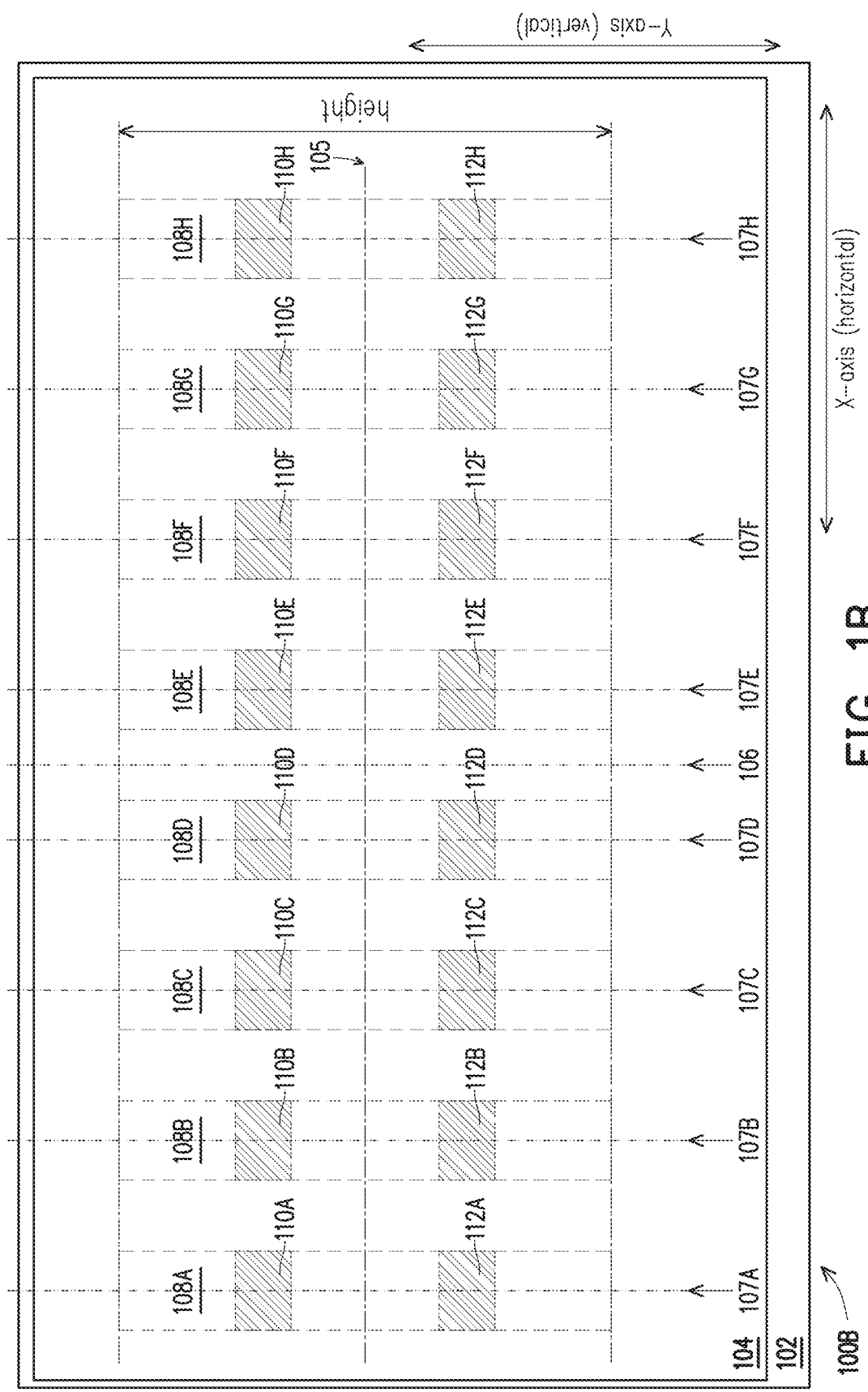
Figure 1C:
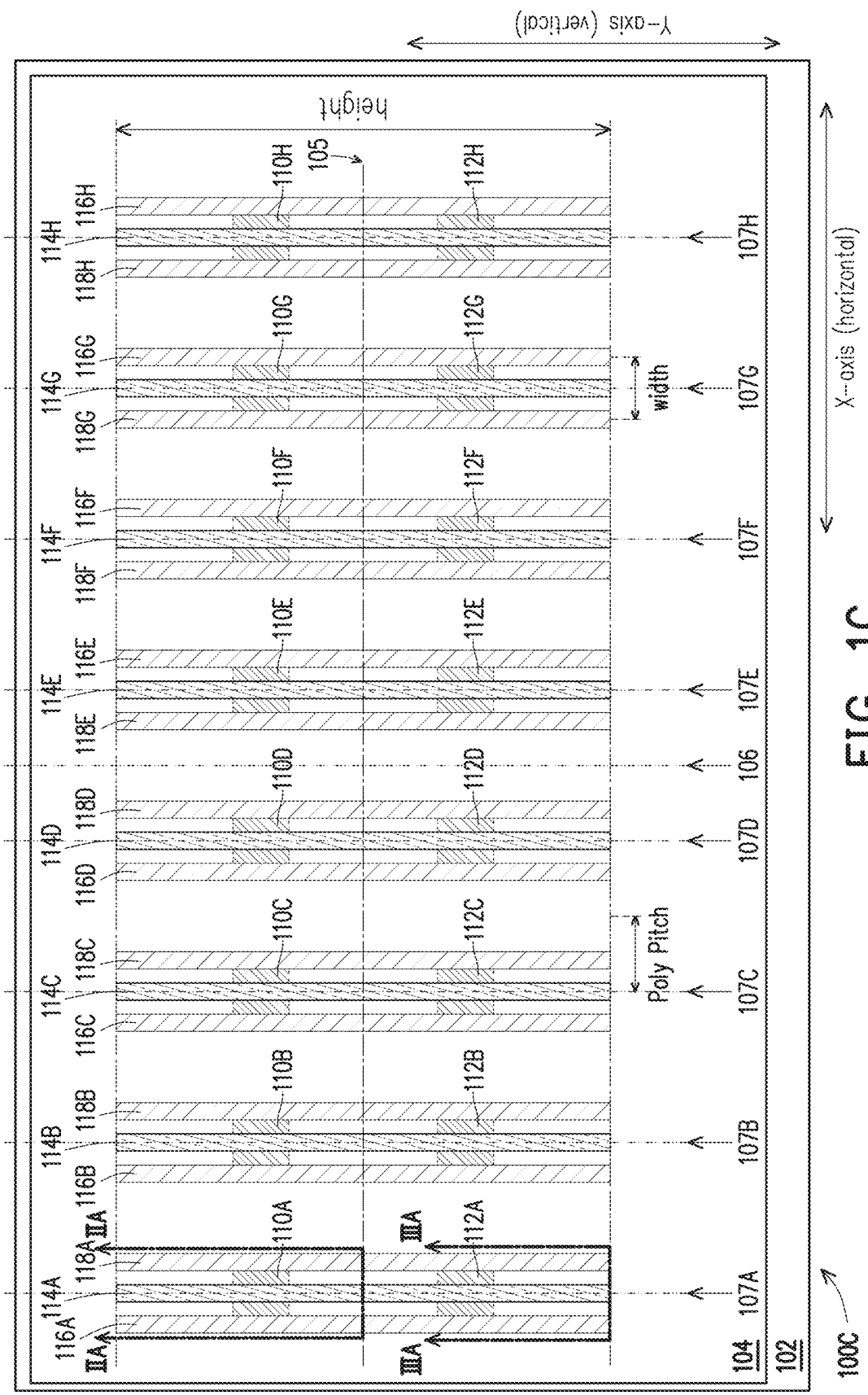
Figure 1D:
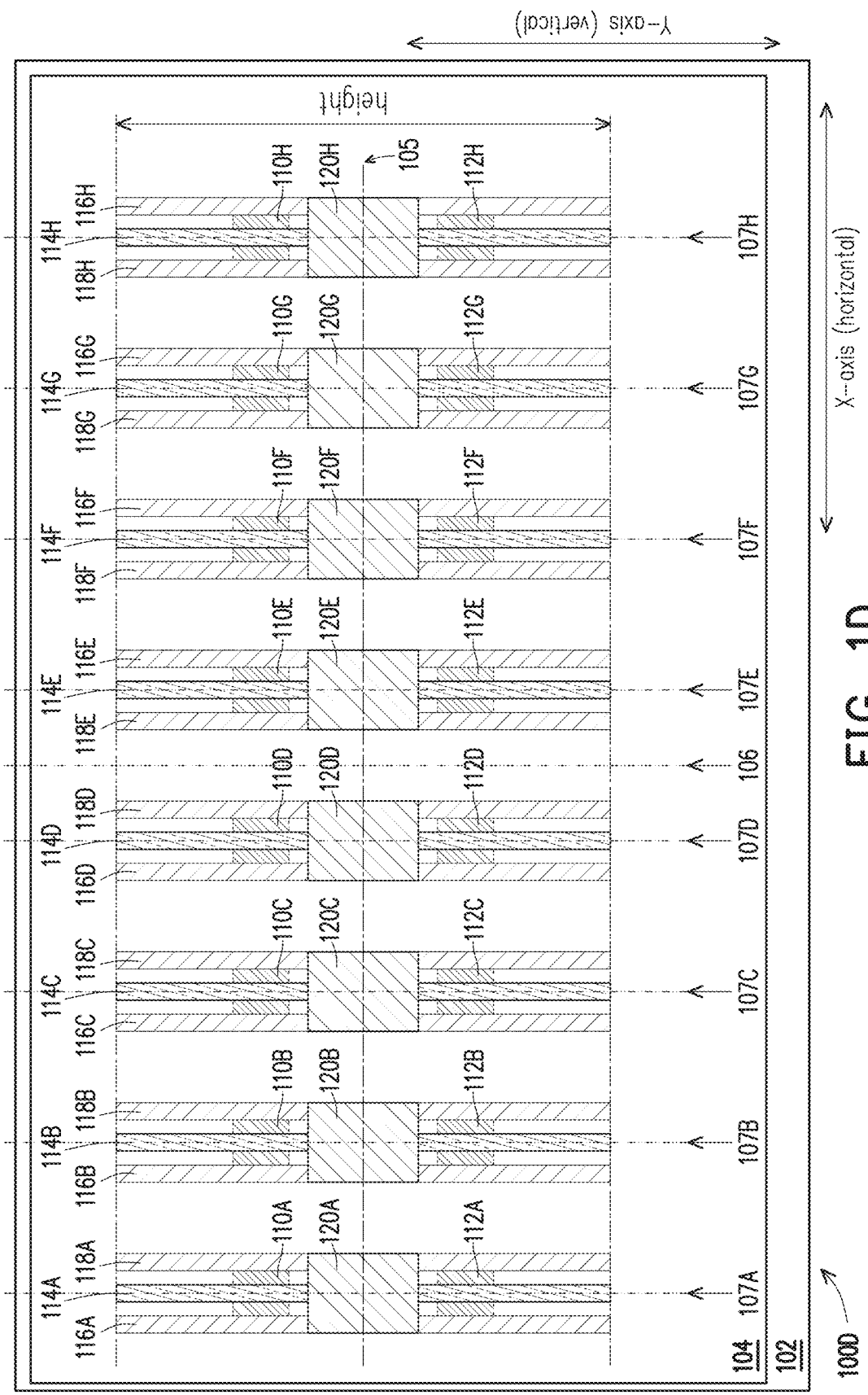
Figure 1E:
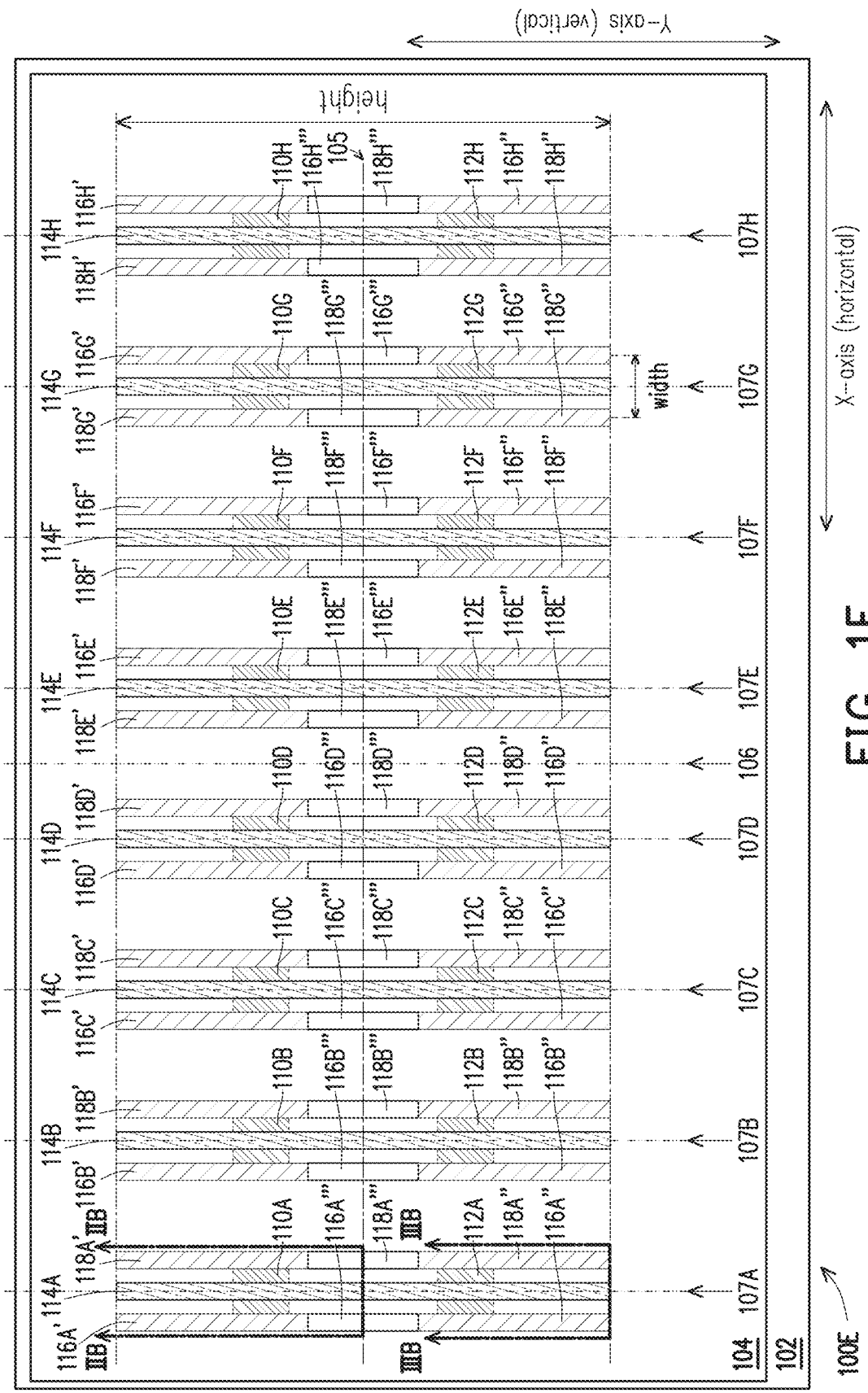
Figure 1F:
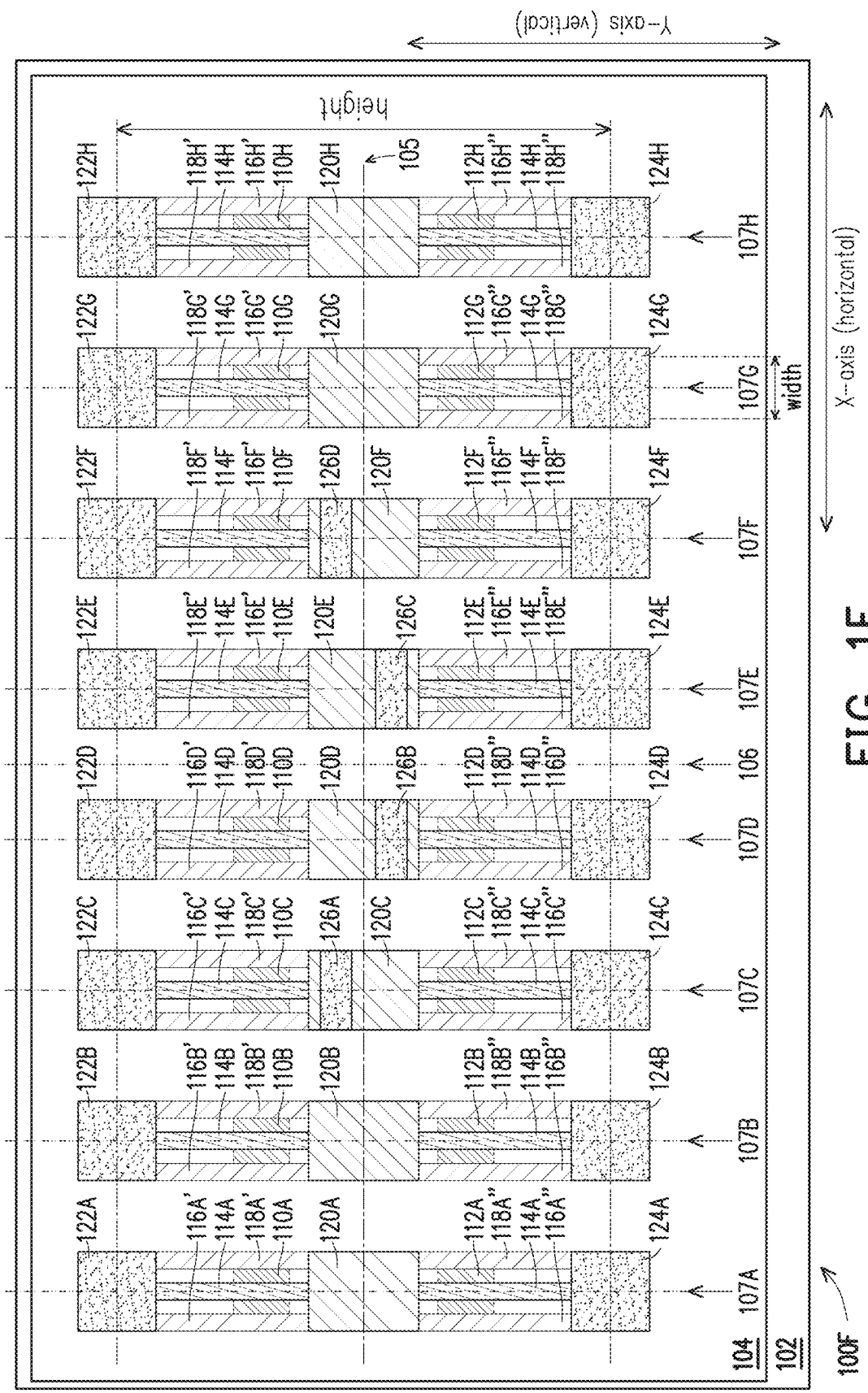
Figure 1G:
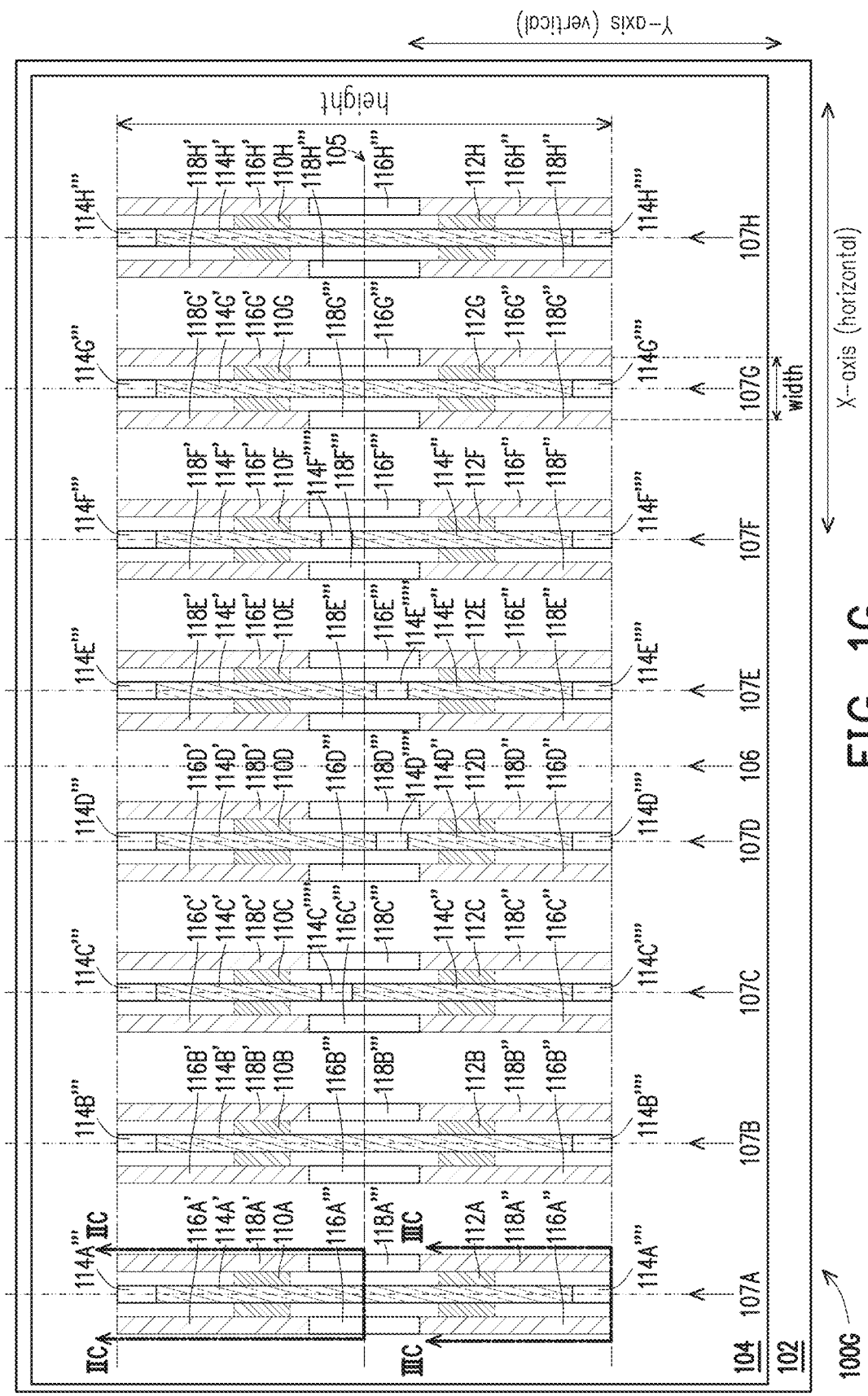
Figure 1H:
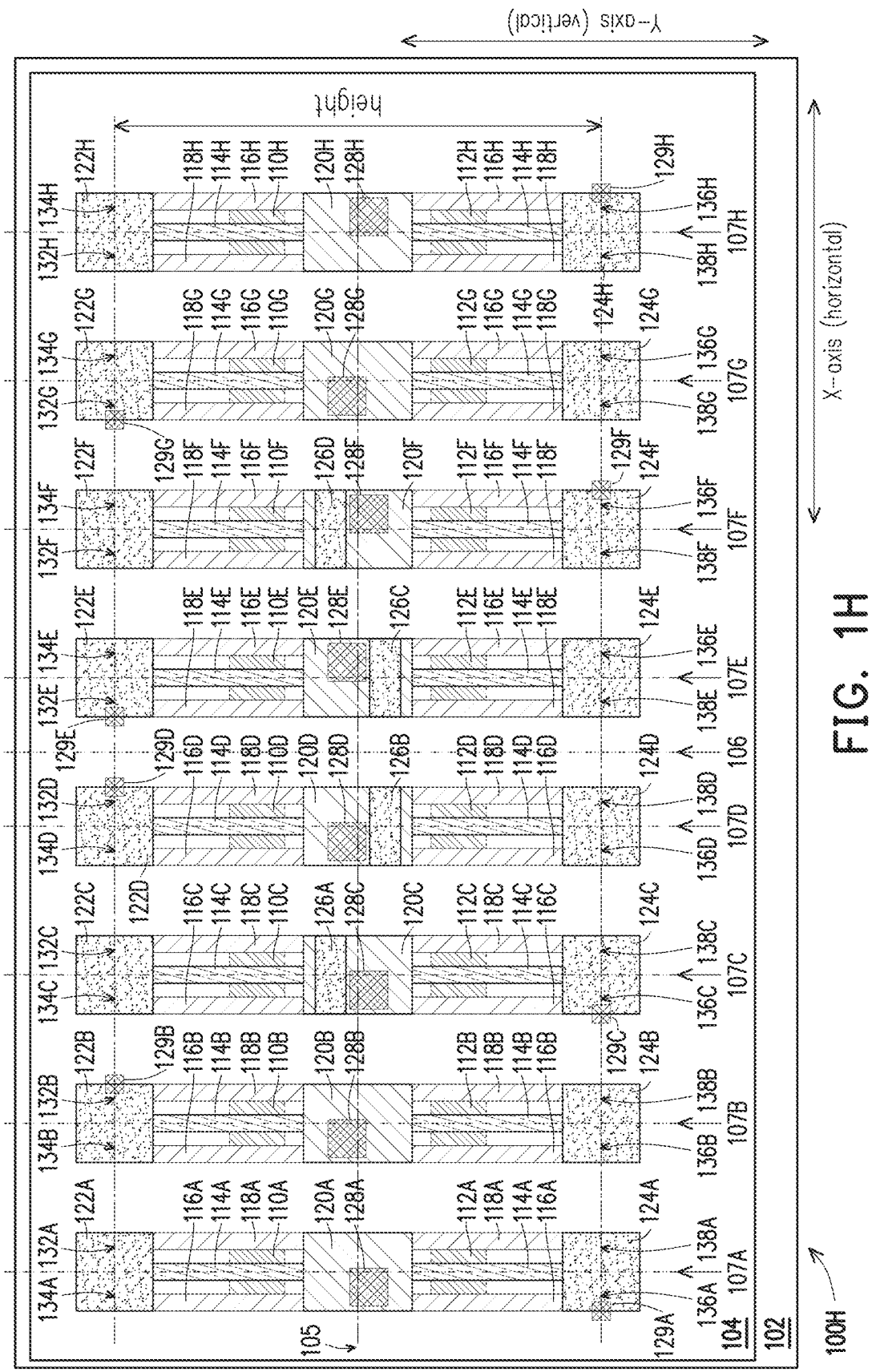
Figure 1I:
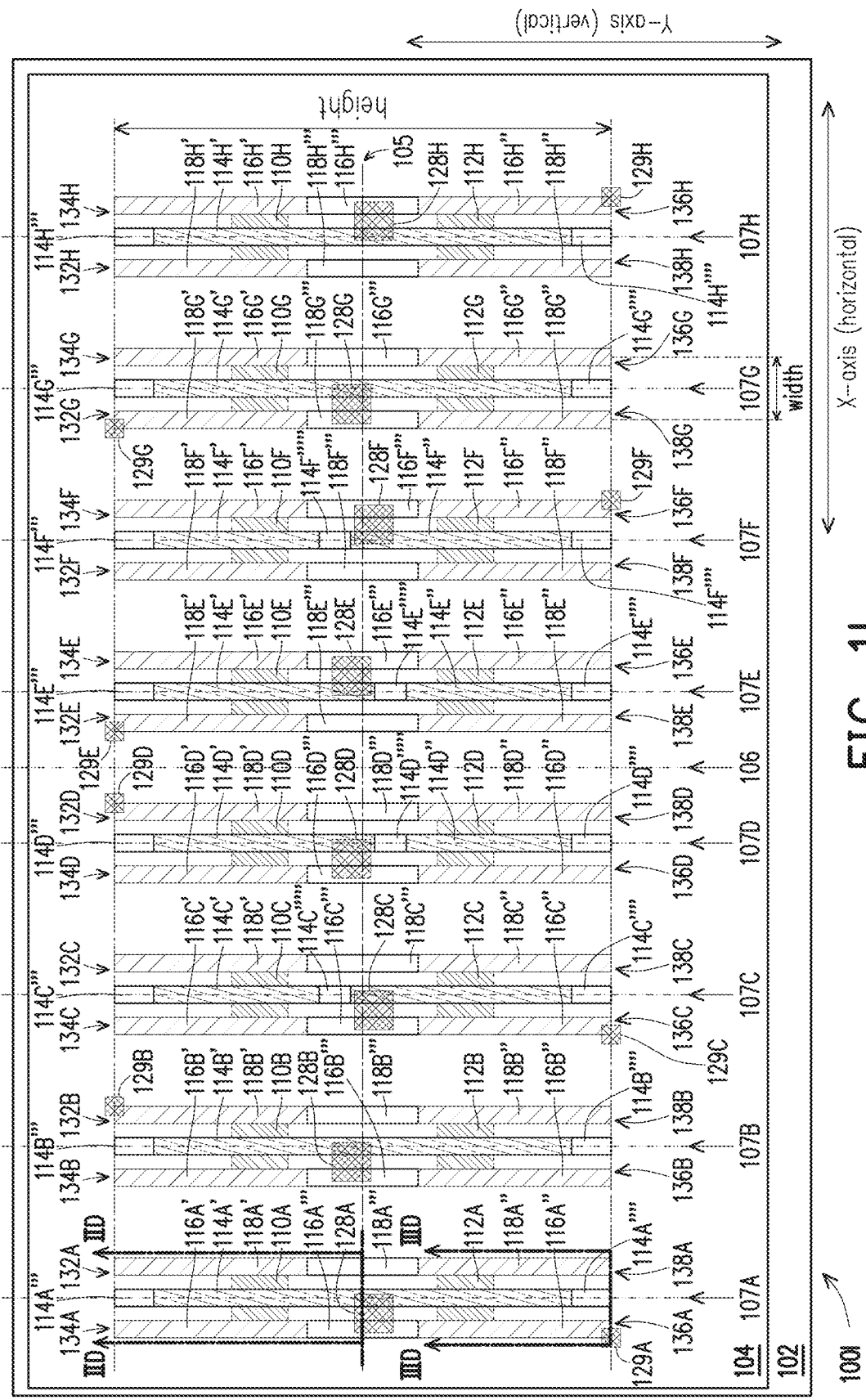
Figure 1J:
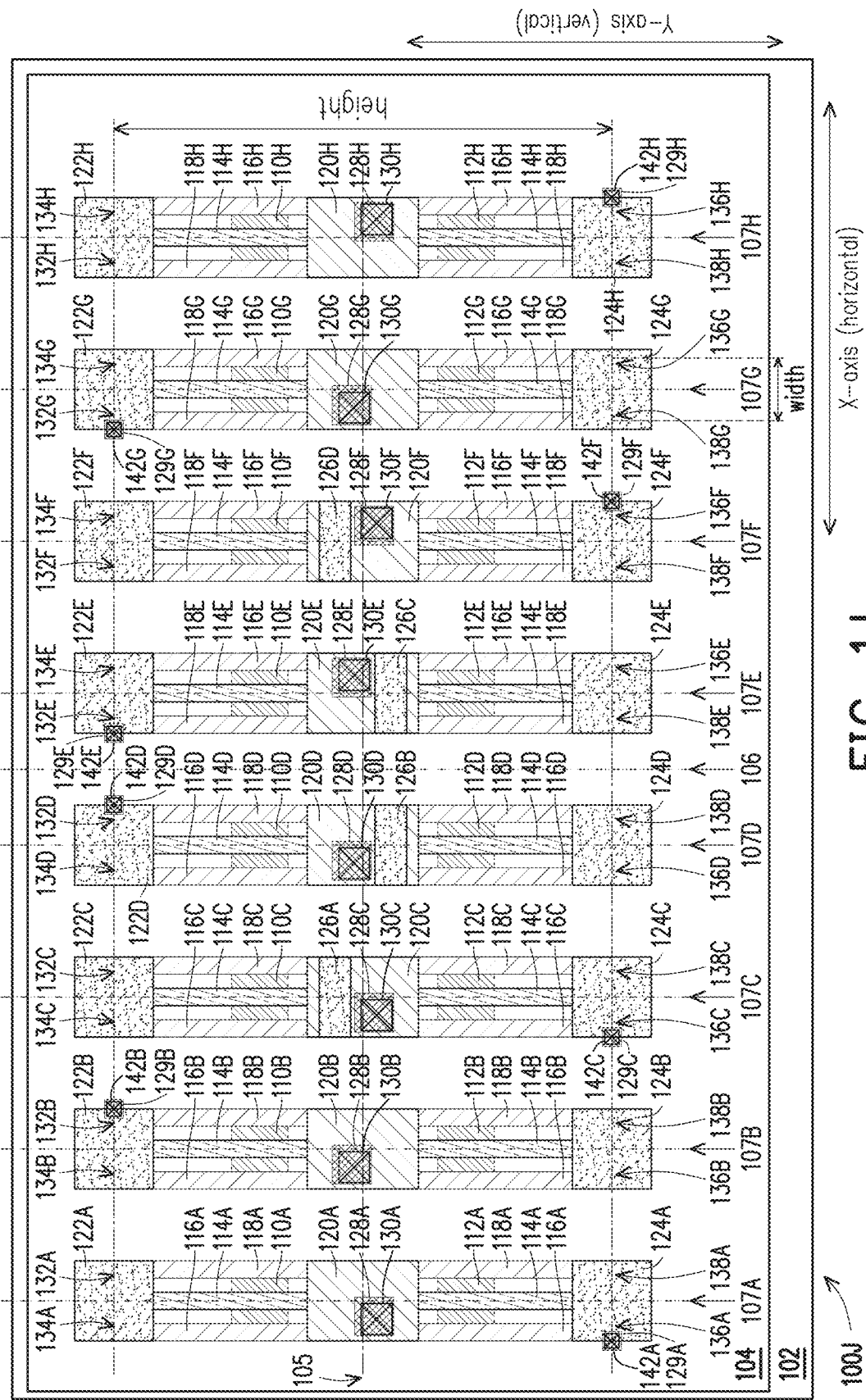
Figure 1K:
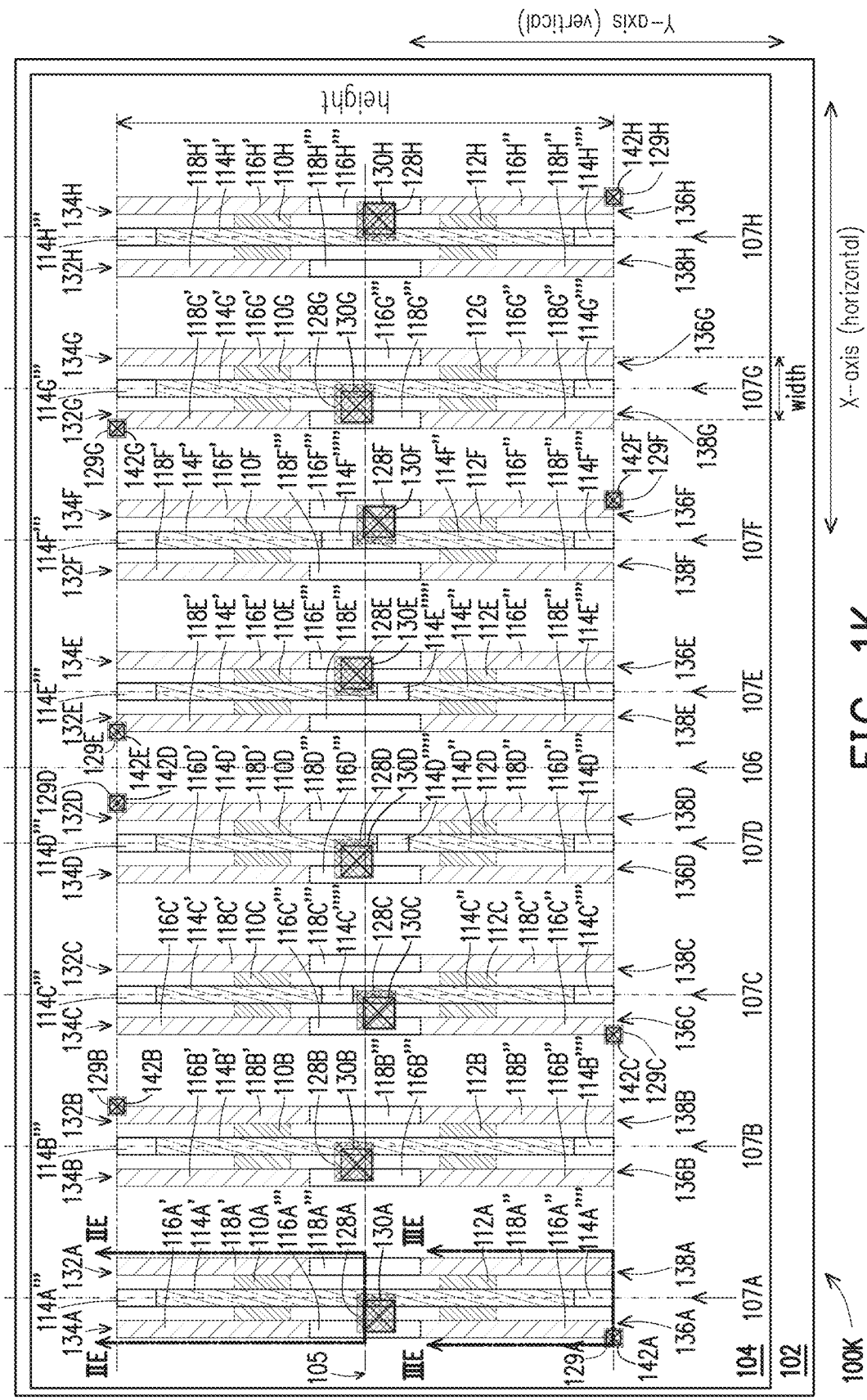
Figure 1L:
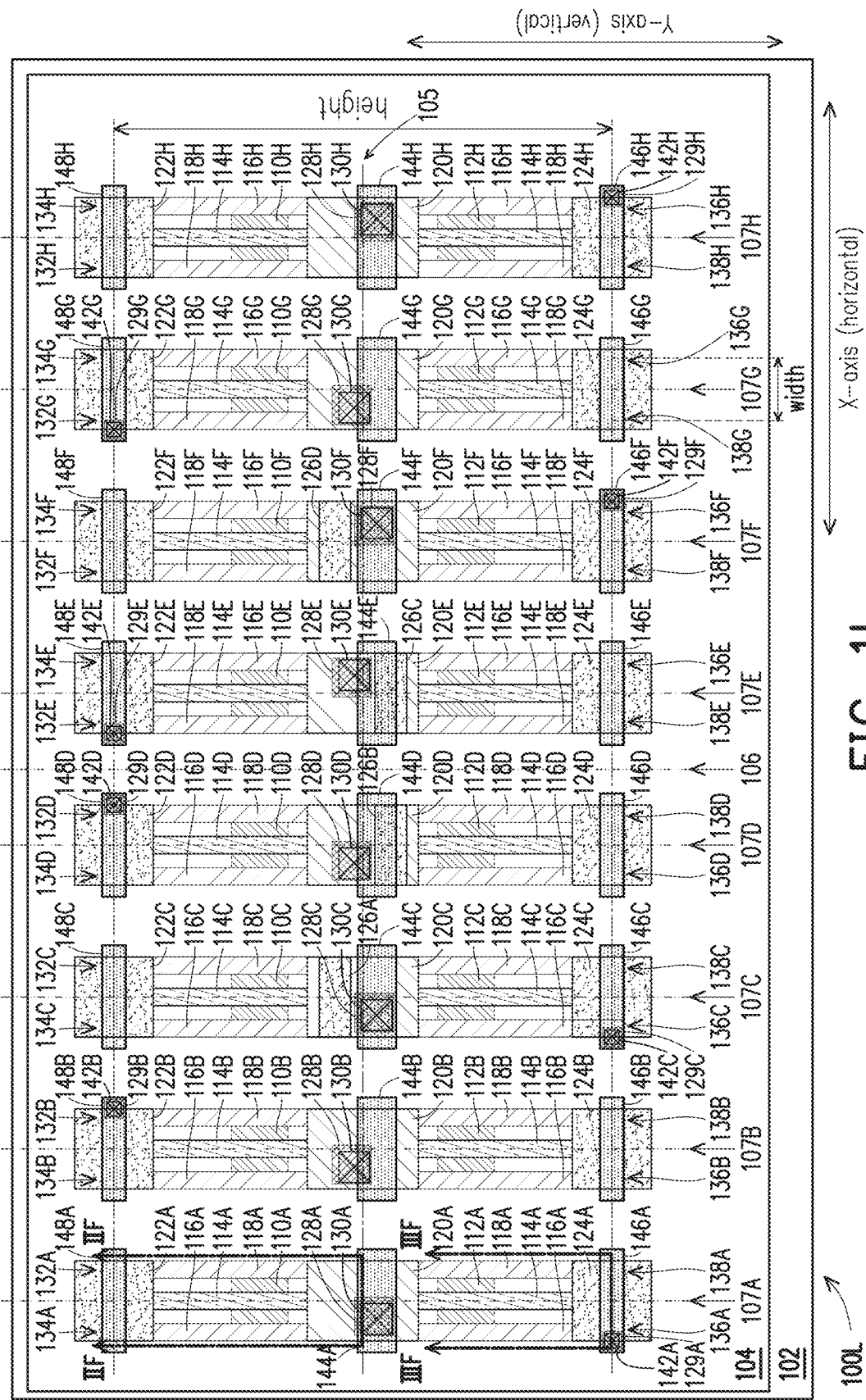

FIGS. 1A-1L relate to each other as follows. FIG. 1A is a simplified pre-cut layout 100A showing various ECO base cells 108A-108H. FIG. 1H is a corresponding detailed pre-cut layout 100H showing all of the inchoate structures and corresponding cut regions understood to be included in pre-cut layout 100A of FIG. 1A. Because pre-cut layout 100H of FIG. 1H is complex, pre-cut layouts 100B-100D and 100F of corresponding FIGS. 1B-1D and 1F are provided. Pre-cut layouts 100B-100D and 100F incrementally introduce inchoate structures and corresponding cut regions included in pre-cut layout 100H. FIG. 1E is a post-cut layout 100E corresponding to pre-cut layout 100D of FIG. 1D. FIG. 1G is a post-cut layout 100G corresponding to pre-cut layout 100F of FIG. 1F. FIG. 1I is a post-cut layout 100I corresponding to pre-cut layout 100H of FIG. 1H. Relative to pre-cut layout 100H, FIG. 1J is a pre-cut layout 100J which further includes vias. FIG. 1K is a post-cut layout 100K corresponding to pre-cut layout 100J of FIG. 1J. Relative to pre-cut layout 100J, FIG. 1L is a pre-cut layout 100L which further includes segments from an overlying metal layer.

In FIG. 1A, pre-cut layout 100A is formed on a substrate 102. Substrate 102 includes a logic area 104 in which standard functional cells (not illustrated) and standard ECO base cells are formed. Logic area 104 is shown as including various ECO base cells 108A-108H. Other quantities of ECO base cells are contemplated. For simplicity of illustration, ECO base cells 108A-108H are represented in FIG. 1A by their corresponding boundaries. For simplicity of illustration, components and intra-ECO-base-cell connections of each of ECO base cells 108A-108H are not shown in FIG. 1A.

As noted, for a given library, all of the standard cells have at least one dimension which is fixed at the same size in order to facilitate placement of the standard cells into a layout. In some embodiments, the fixed size is a multiple of a library-specific fixed dimension. In some embodiments, the fixed size is a multiple of the minimum pitch between polysilicon features, $P_{POLY}$.

In some embodiments, the standard cells (including functional cells and ECO cells) are polygons. In some embodiments, the standard cells are rectangular polygons. In some embodiments, from the perspective of a plan view, the X-axis is horizontal and the Y-axis is vertical such that the horizontal and vertical dimensions of a rectangular standard cell are described as the corresponding width and height of the cell. In some embodiments, the layout is arranged in rows, and the height of all the standard cells is the same to facilitate placing the standard cells into the rows of the layout.

Returning to FIG. 1A, ECO base cells 108A-108H are arranged in the horizontal direction. All of ECO base cells 108A-108H have the same size in the vertical direction (same height); alternatively, other configurations are within the scope of the present disclosure.

To facilitate inter-cell connections, a layout comprises a stack of planar 'metallization' layers interspersed with planar inter-layer dielectric (ILD) structures. A given 'metallization' layer includes parallel conductive line segments. In some embodiments, the conductive line segments are metal. In some embodiments, the parallel line segments in successive metallization layers are orthogonal to each other. In some embodiments, the parallel line segments in an ith metallization layer (M(i)) extend in a first direction, the parallel line segments in an (i+1)th metallization layer (M(i+1)) extend in a second direction which is orthogonal to the first direction, the parallel line segments in an (i+2)th metallization layer (M(i+2)) extend in the first direction, the parallel line segments in an (i+3)th metallization layer (M(i+3)) extend in the second direction, and so on. In some embodiments, the first direction is parallel to the X-axis, and the second direction is parallel to the Y-axis.

In some embodiments, the M(i) layer is the first metallization layer overlying inter-layer connection structures such as vias, e.g., the vias corresponding to patterns 130A-130H, via 220, the vias corresponding to patterns 142A-142H, via 330, or the like. According to some metallization-layer numbering schemes, i is the non-negative integer zero (i=0) such that M(i)=M(0). According to some other metallization-layer numbering schemes, i is the non-negative integer one (i=1) such that M(i)=M(1). The present disclosure assumes a metallization-layer numbering scheme in which i is the non-negative integer one (i=1) such that, in FIGS. 1A-1L, M(i)=M(1).

Pre-cut layout 100A shows a horizontal first axis 105 of symmetry, which is common to each of ECO base cells 108A-108H. Pre-cut layout 100A further shows a vertical second axis 106 of symmetry. As will become more apparent in the following discussion of FIGS. 1C-1K, and relative to vertical second axis 106, ECO base cell 108H is mirror symmetric to ECO base cell 108A, ECO base cell 108G is mirror symmetric to ECO base cell 108B, ECO base cell 108F is mirror symmetric to ECO base cell 108C, and ECO base cell 108E is mirror symmetric to ECO base cell 108D. Furthermore, ECO base cells 108A-108H have corresponding internal vertical axes of symmetry 107A-107H. Pre-cut layout 100A yet further shows axes of symmetry 107A-107H which are internal to corresponding ECO base cells 108A-108H. As will become more apparent in the following discussion of FIGS. 1C-1K, ECO base cell 108A is symmetric with respect to internal axis 107A, ECO base cell 108B is symmetric with respect to internal axis 107B, and so on.

In FIG. 1B, patterns representing active areas (or oxide-definition areas) in substrate 102 (FIG. 1A) are added to pre-cut layout 100A of FIG. 1A to form pre-cut layout 100B. Taking ECO base cell 108A as an example of ECO base cells 108A-108H, ECO base cell 108A includes patterns 110A and 112A representing active areas in substrate 102 (FIG. 1A). Patterns 110A and 112A are disposed symmetrically about and away from horizontal first axis 105.

In FIG. 1C, patterns representing inchoate conductive structures are added to pre-cut layout 100B of FIG. 1B to form pre-cut layout 100C. ECO base cells 108A-108H include corresponding patterns 114A-114H representing inchoate gate structures. In some embodiments, the inchoate gate structures corresponding to patterns 114A-114H are formed of doped semiconductor material, or the like. In some embodiments, the inchoate gate structures corresponding to patterns 114A-114H are formed of doped polysilicon. Patterns 114A-114H are collinear with respect to corresponding internal axes of symmetry 107A-107H.

ECO base cells 108A-108H further include patterns 116A-116H and 118A-118H representing inchoate drain/source structures. In some embodiments, the inchoate drain/source structures corresponding to patterns 116A-116H and 118A-118H are formed of doped semiconductor material, or the like. In some embodiments, the inchoate drain/source structures corresponding to patterns 116A-116H and 118A-118H are formed doped polysilicon.

Patterns 116A-116H and 118A-118H are disposed symmetrically about and away from corresponding internal axes of symmetry 107A-107H. In ECO base cells 108A-108D, patterns 116A-116D are disposed to the left and patterns 118A-118D are disposed to the right of corresponding internal axes of symmetry 107A-107D. In ECO base cells 108E-108H, patterns 118E-118H are disposed to the left and patterns 116E-116H are disposed to the right of corresponding internal axes of symmetry 107E-107H.

Relative to vertical second axis 106, the following pairs of conductive patterns are mirror symmetric: 118D and 118E; 116D and 116E; 118C and 118F; 116C and 116F; 118B and 118G; 116B and 116G; 118A and 118H; and 116A and 116H. ECO base cell 108H is mirror symmetric to ECO base cell 108A, ECO base cell 108G is mirror symmetric to ECO base cell 108B, ECO base cell 108F is mirror symmetric to ECO base cell 108C, and ECO base cell 108E is mirror symmetric to ECO base cell 108D.

In some embodiments, the conductive patterns in any given ECO base cell are regularly spaced apart. Taking ECO base cell 108A as an example, patterns 114A, 116A and 118A are regularly spaced apart. In some embodiments, taking ECO base cell 108A as an example, a horizontal distance between a midline (extending in the vertical direction) of pattern 116A and a midline (extending in the vertical direction) of pattern 118A is a multiple of the minimum pitch between polysilicon features, $P_{POLY}$, and represents a width of ECO base cell 108A. In some embodiments, taking ECO base cell 108A as exemplary, the multiple of $P_{POLY}$ representing the width of ECO base cell 108A is one such that the width of ECO base cell 108A equals $P_{POLY}$.

In FIG. 1D, patterns representing first cut regions are added to pre-cut layout 100C of FIG. 1C to form pre-cut layout 100D. ECO base cells 108A-108H include corresponding patterns 120A-120H representing cut regions relative to corresponding patterns 116A-116H and 118A-118H (representing inchoate drain/source structures). Patterns 120A-120H indicate that corresponding underlying portions of drain/source structures (corresponding to patterns 116A-116H and 118A-118H) will be cut. Accordingly, patterns such as patterns 120A-120H are referred to herein as cut-patterns. Though cut-patterns 120A-120H overlie corresponding patterns 114A-114H (representing inchoate gate structures), cut-patterns 120A-120H do not indicate that the corresponding underlying portions of patterns 114A-114H will be cut. Cut-patterns 120A-120H are symmetric with respect to horizontal first axis 105 such that central portions of corresponding underlying drain/source structures (corresponding to patterns 116A-116H and 118A-118H) will be cut.

FIG. 1E is a post-cut layout 100E corresponding to pre-cut layout 100D. In post-cut layout 100E, the central portions of the drain/source structures (corresponding to patterns 116A-116H and 118A-118H) have been cut/removed according to corresponding cut-patterns 120A-120H (of FIG. 1D, which represent cut regions). For example, consider the results of cut-pattern 120A, which include: drain source patterns 116A' and 116A" remaining albeit separated by a gap 116A'''; and drain source patterns 118A' and 118A" remaining albeit separated by a gap 118A'''. More generally, as a result of cut-patterns 120A-120H, residual drain/source structures remain corresponding to patterns 116A'-116H', 116A"-116H", 118A'-118H' and 118A"-118H". Also as a result, gaps 116A'''-116H''' and 118A'''-118H''' remain between drain/source structures corresponding to patterns 116A'-116H', 116A"-116H", 118A'-118H' and 118A"-118H".

In FIG. 1F, patterns representing second, third and fourth cut regions are added to pre-cut layout 100D of FIG. 1D to form pre-cut layout 100F. ECO base cells 108A-108H include corresponding cut-patterns 122A-122H and 124A-124H representing corresponding second and third cut regions relative to corresponding patterns 114A-114H (representing inchoate gate structures). ECO base cells 108C-108F further include corresponding cut-patterns 126A-126D representing corresponding fourth cut regions relative to corresponding patterns 114C-114F.

For example, consider ECO base cell 108A, to which has been added: a cut-pattern 122A representing a second cut region affecting an underlying portion of pattern 114A (see FIG. 1E); and a cut-pattern 124A representing a third cut region affecting an underlying portion of pattern 114A (see FIG. 1E). Cut-pattern 122A indicates that a portion of the gate structure (corresponding to pattern 114A) which underlies cut-pattern 122A will be cut, which will result in a gap 114A''' (See FIG. 1G, discussed below). Cut-pattern 124A indicates that a portion of the gate structure (corresponding to pattern 114A) which underlies cut-pattern 124A will be cut, which will result in a gap 114A'''' (See FIG. 1G, discussed below). Similarly, cut-patterns 122B-122H and 124B-124H indicate that portions of gate structures (corresponding to patterns 114A-114H) underlying cut-patterns 122B-122H and 124B-124H will be cut. Referring back to the example, portions of patterns 116A' and 118A' underlie cut-pattern 122A. However, cut-pattern 122A does not indicate that the underlying portions of patterns 116A' and 118A' will be cut. Also, portions of patterns 116A'' and 118A'' underlie cut-pattern 124A. However, cut-pattern 124A does not indicate that the underlying portions of patterns 116A'' and 118A'' will be cut. Similarly, relative to horizontal first axis 105, cut-patterns 122B-122H and 124B-124H are disposed over not only over ends of corresponding patterns 114B-114H, but also over ends of corresponding patterns 116B'-116H', 116B''-116H'', 118B'-118H' and 118B''-118H'' such that end portions of underlying gate structures (corresponding to patterns 114A-114H) will be cut.

Relative to horizontal first axis 105, the following pairs of cut-patterns are mirror symmetric: 122A &124A; 122B &124B; 122C &124C; 122D &124D; 122E &124E; 122F & 124F; 122G &124G; and 122H &124H. More generally, though cut-patterns 122A-122H and 124A-124H overlie corresponding patterns 116A'-116H', 116A''-116H'', 118A'-118H' and 118A''-118H'' (representing drain/source structures), cut-patterns 122A-122H and 124A-124H do not indicate that the corresponding underlying portions of patterns 116A'-116H', 116A''-116H'', 118A'-118H' and 118A''-118H'' will be cut.

Cut-patterns 126A-126D indicate that underlying portions of corresponding gate structures (corresponding to patterns 114C-114F) will be cut. Cut-patterns 126A-126D are located over areas bounded by corresponding patterns 120C-120F. Relative to the vertical direction, cut-patterns 126A and 126D are correspondingly disposed above horizontal first axis 105; and patterns 126B-126C are correspondingly disposed below horizontal first axis 105. Relative to vertical second axis 106, the following pairs of cut-patterns are mirror symmetric: 126A and 126D; and 126B and 126C. For example, consider ECO base cell 108C, to which has been added cut-pattern 126A representing a fourth cut region affecting an underlying portion of pattern 114 (see FIG. 1E). Cut-pattern 126A indicates that a portion of the gate structure (corresponding to pattern 114C) which underlies cut-pattern 126A will be cut, which will result in a gap 114A''''' (See FIG. 1G, discussed below).

FIG. 1G is a post-cut layout 100G corresponding to pre-cut layout 100F, which has resulted (among other things) in patterns 114A', 114B', 114C', 114C'', 114D', 114D'', 114E', 114E'', 114F', 114F'', 114G' and 114H'. For example, consider ECO base cell 108A, in which the end portions of the gate structure (corresponding to former pattern 114A) have been cut/removed according to cut-patterns 122A and 124A (see FIG. 1F), resulting in remaining pattern 114A'. Gaps 114A''' and 114A'' now appear at corresponding ends of pattern 114A'. Also, for example, consider ECO base cell 108C, in which the end portions of the gate structure (corresponding to former pattern 114C) have been cut/removed according to cut-patterns 122C and 124C (see FIG. 1F), and in which a central portion of the gate structure has been cut/removed according to cut-pattern 126A (see FIG. 1F), resulting in a pair of patterns 114C' and 114C'' remaining. Proximal ends of patterns 114C' and 114C'' are separated by gap 114C'''''. Gap 114C''' now appears at a distal end of pattern 114C'. Gap 114A'''' now appears at a distal end of pattern 114A''.

Similarly, in post-cut layout 100G, the end portions of the gate structures (corresponding to former patterns 114B-114H) have been cut/removed according to corresponding cut-patterns 122B-122H (of FIG. 1F, representing cut regions). Also similarly, in post-cut layout 100G, central portions of some of the gate structures (corresponding to patterns 114D-114F) have been cut/removed according to corresponding cut-patterns 126B-126D. ECO base cells 108A, 108B, 108G and 108H include single (or unitary) residual gate structures (corresponding to patterns 114A', 114B', 114G' and 114H') ECO base cells 108C-108F include pairs of residual gate structures (corresponding to pairs of patterns 114C'&114C'', 114D'&114D'', 114E' &114E'', 114F'&114F'') remaining as the residuals resulting from the cuts corresponding to the following groupings of cut-patterns: 122C, 126A and 124C; 122D, 126B and 124D; 122E, 126C and 124E; and 122F, 126D and 124F.

Below horizontal first axis 105 in the vertical direction, and as a result of the cuts made according to cut-patterns 124A-124H, gaps 114A''-114H'' now appear at corresponding ends of ECO base cells 108A-108H. More particularly, gaps 114A''''-114A'''' now appear at ends of the gate structures (corresponding to patterns 114A', 114B', 114C'', 114D'', 114E'', 114F'', 114G' and 114H') located below horizontal first axis 105 in the vertical direction. Above horizontal first axis 105 in the vertical direction, and as a result of the cuts made according to cut-patterns 122A-122H, gaps 114A'''-114H''' now appear at corresponding ends of ECO base cells 108A-108H. More particularly, gaps 114A'''-114H''' now appear at ends of the gate structures (corresponding to patterns 114A'-114H') located above horizontal first axis 105 in the vertical direction.

For example, consider ECO base cell 108C, in which the central portion of the gate structure has been cut/removed according to cut-pattern 126A (see FIG. 1F). As a result, the pair of patterns 114C' and 114C'' remains, separated by gap 114C'''''. Relative to the vertical direction, the length of pattern 114C' is shorter than the length of pattern 114C'' such that the pair of patterns 114C' and 114C'' is described as asymmetric in the vertical direction relative to horizontal first axis 105. Similarly, as a result of the cuts made according to cut-patterns 126B-126D, gaps 114D''-114F''''' now appear between gate structures (corresponding to pairs of patterns 114D'&114D'', 114E'&114E'' and 114F'&114F''). As a result of the cuts made according to cut-patterns 126B-126D, the gate structures corresponding to the following pairs of patterns are asymmetric: 114D' and 114D''; 114E' and 114E''; and 114F' and 114F''.

In FIG. 1H, patterns representing first and second tolerance contacts are added to pre-cut layout 100F of FIG. 1F to form pre-cut layout 100H. For example, ECO base cell 108A includes pattern 128A representing a first tolerance contact. Pattern 128A overlaps horizontal first axis 105. Pattern 128A is located over an area bounded by cut-pattern 120A. Relative to the vertical direction, a majority of the area of pattern 128A is disposed below horizontal first axis 105. As such, the first tolerance contact corresponding to pattern 128A is located asymmetrically about horizontal first axis 105. Similarly, ECO base cells 108B-108H include corresponding patterns 128B-128H representing first tolerance contacts. Each of patterns 128B-128H overlaps horizontal first axis 105. Patterns 128B-128H are located over areas bounded by corresponding patterns 120B-120H. Relative to the vertical direction, a majority of the area of each of patterns 128C, 128F and 128H is disposed below horizontal first axis 105, whereas a majority of the area of each of patterns 128B, 128D, 128E and 128G is disposed above horizontal first axis 105. As such, the first tolerance contacts corresponding to patterns 128B-128H are located asymmetrically about horizontal first axis 105.

In some embodiments, patterns 128A-128H are shaped as squares. For example, pattern 128A is shaped as a square. Relative to the horizontal direction, the first tolerance contact (corresponding to pattern 128A) occupies an area which substantially overlaps a portion of the gate structure corresponding to pattern 114A'. Also relative to the horizontal direction, the first tolerance contact (corresponding to pattern 128A) extends so as to substantially overlap a portion of corresponding gap 116A''' (see FIG. 1G), where gap 116A''' (again) separates patterns 116A' and 116A''. Similarly, relative to the horizontal direction, the first tolerance contacts (corresponding to patterns 128B-128H) occupy areas which substantially overlap portions of gate structures corresponding to patterns 114B', 114C'', 114D', 114E', 114F'', 114G' and 114H'. Also similarly, relative to the horizontal direction, the first tolerance contacts (corresponding to patterns 128B-128H) extend so as to substantially overlap portions of corresponding gaps 116B'''-116H''' (see FIG. 1G). In some embodiments, patterns 128A-128H occupy areas which substantially overlap a majority of the width of the portions of gate structures corresponding to patterns 114A', 114B', 114C'', 114D', 114E', 114F'', 114G' and 114H'. In some embodiments, patterns 128A-128H occupy areas which substantially overlap about 95% of the width of the portions of gate structures corresponding to patterns 114A', 114B', 114C'', 114D', 114E', 114F'', 114G' and 114H'. Similarly, in some embodiments, patterns 128A-128H occupy areas which substantially overlap a majority of the width of the portions of corresponding gaps 114A'''-114H'''. In some embodiments, patterns 128A-128H occupy areas which substantially overlap about 95% of the width of corresponding gaps 114A'''-114H'''.

In pre-cut layout 100H of FIG. 1H: labels 132A-132H denote ends (located above horizontal first axis 105) of drain/source structures corresponding to patterns 118A-118H; labels 134A-134H denote ends (located above horizontal first axis 105) of drain/source structures corresponding to patterns 116A-116H; labels 136A-136H denote ends (located below horizontal first axis 105) of drain/source structures corresponding to patterns 116A-116H; and labels 138A-138H denote ends (located below horizontal first axis 105) of drain/source structures corresponding to patterns 118A-118H. Each of ends 132A-132H, 134A-134H, 136A-136H and 138A-138H has two corners, an inward corner and an outward corner. Inward corners are located closer (in the horizontal direction) to corresponding axes 107A-107H than are outward corners.

ECO base cells 108A-108H further include corresponding patterns 129A-129H representing second tolerance contacts. In some embodiments, the second tolerance contacts (corresponding to patterns 129A-129H) overlap outward corners of corresponding ends 136A, 132B, 136C, 132D, 134E, 136F, 132G and 136H of drain/source structures corresponding to patterns 116A, 118B, 116C, 118D, 118E, 116F, 118G and 116H. Other and/or additional locations of second tolerance contacts (corresponding to patterns 129A-129H) are contemplated. In some embodiments, a given ECO base cell has multiple outward corners overlapped by patterns representing second contacts. For example, in some embodiments, in addition to pattern 129A representing a first instance of a second tolerance contact overlapping outward corner of end 136A, ECO base cell 102A includes at least one additional instance of pattern 129A (not shown) overlapping a corresponding at least one outward corner or corresponding ends 132A, 134A and 138A.

In some embodiments, patterns 129A-129H are shaped as squares. Other shapes for patterns 129A-129H are contemplated. In some embodiments, patterns 129A-129H are centered over the outward corners of corresponding ends 136A, 132B, 136C, 132D, 134E, 138F, 134G and 138H of drain/source structures corresponding to patterns 116A, 118B, 116C, 118D, 118E, 116F, 118G and 116H. In some embodiments, the widths of patterns 129A-129H are substantially the same as the widths of corresponding patterns 116A, 118B, 116C, 118D, 118E, 116F, 118G and 116H.

FIG. 1I (again) is a post-cut layout 100I, which is a post-cut layout corresponding to pre-cut layout 100H of FIG. 1H. As such, post-cut layout 100I of FIG. 1I shows the results of pre-cut layout 100H of FIG. 1H.

In FIG. 1J, patterns representing first and second vias are added to pre-cut layout 100H of FIG. 1H to form pre-cut layout 100J. For example, in ECO base cell 108A, a first via (corresponding to pattern 130A) is located over, and within, an area bounded by the first tolerance contact (corresponding to pattern 128A). Also, a second via (corresponding to pattern 142A) is located over, and within, an area bounded by the second tolerance contact (corresponding to pattern 129A). In some embodiments, the first via (corresponding to pattern 130A) is connected to a first metallization segment 144A (see FIG. 1L) in the immediately overlying metallization layer. Similarly, patterns 130B-130H representing the first vias are overlaid onto ECO base cells 108B-108H. In some embodiments, the first vias (corresponding to patterns 130B-130H) are connected to corresponding segments 144B-144H (see FIG. 1L) in the immediately overlying metallization layer, M(i).

The first vias (corresponding to patterns 130A-130H) are located over, and within, areas bounded by the first tolerance contacts (corresponding patterns 128A-128H). The second vias (corresponding to patterns 142A-142H) are located over, and within, areas bounded by the second tolerance contacts (corresponding to patterns 129A-129H). Each of the first vias (corresponding to patterns 128A-128H) overlaps horizontal first axis 105. Relative to the vertical direction, however, a majority of the area of each of patterns 130A, 130C, 130F and 130H is disposed below horizontal first axis 105, while a majority of the area of each of patterns 130B, 130D, 130E and 130G is disposed above horizontal first axis 105. As such, the first vias (corresponding to patterns 130A-130H) are located asymmetrically about horizontal first axis 105.

Because the areas of the tolerance contacts (corresponding to patterns 128A-128H) are larger than the areas of the first vias (corresponding to patterns 130A-130H), the precision with which the first vias must be aligned with respect to the underlying gate structures (corresponding to patterns 114A-114H) is reduced. For example, in ECO base cell 108A, the precision to align the first via (corresponding to pattern 130A) with respect to the underlying gate structure (corresponding to pattern 114A) is referred to as alignment-tolerance. Because the tolerance contact (corresponding to pattern 128A) is larger than the first via (corresponding to pattern 130A), the alignment-tolerance is increased, which confers an advantage, e.g., in terms of manufacturability. As a result, first metallization segment 144A (see FIG. 1L) which immediately overlies the first via (corresponding to pattern 130A) is reduced in size in the width and/or height direction proportionately to the change in alignment-tolerance. Similarly, the tolerance contacts (corresponding to patterns 128B-128H) increase the alignment-tolerances with respect to the underlying gate structures (corresponding to patterns 114A-114H). As a result, first metallization segments 144B-144H (see FIG. 1L) which immediately overlie the first vias (corresponding to patterns 130B-130H) are reduced in size in the width and/or height direction proportionately to the change in alignment-tolerance. When the size of overlying first metallization segments 144A-144H (see FIG. 1L) is reduced in the vertical direction, the overall height of the corresponding ECO base cells is reduced.

ECO base cells 108A-108H further include corresponding patterns 142A-142H representing the second vias. In some embodiments, the second vias (corresponding to patterns 142A-142H) are connected to corresponding segments in the immediately overlying metallization layer, M(i).

FIG. 1K (again) is a post-cut layout 100K, which is a post-cut layout corresponding to pre-cut layout 100J of FIG. 1J. As such, post-cut layout 100K of FIG. 1K shows the results of pre-cut layout 100J of FIG. 1J.

In FIG. 1L, patterns representing immediately overlying first, second and third metallization segments are added to pre-cut layout 100J of FIG. 1J to form pre-cut layout 100L. Patterns 144A-144H representing the first metallization segments in M(i) (corresponding to patterns 144A-144H) are correspondingly overlaid onto the first vias (corresponding to patterns 130A-130H). Patterns 146A-146H representing the second metallization segments in M(i) are correspondingly overlaid over ends 136A-136H and 138A-138H of the drain/source structures corresponding to patterns 116A-116H and 118A-118H. Patterns 148A-148H representing the third metallization segments in M(i) are correspondingly overlaid over ends 134A-134H and 132A-132H of the drain/source structures corresponding to patterns 116A-116H and 118A-118H. In some embodiments, the second metallization segments in M(i) (corresponding to patterns 146A, 146C, 146F and 146H) are correspondingly overlaid onto the second vias (corresponding to patterns 142A, 142C, 142F and 142H). In some embodiments, the third metallization segments in M(i) (corresponding to patterns 148B, 148D, 148E and 148G) are correspondingly overlaid onto the second vias (corresponding to patterns 142B, 142D, 142E and 142G).

In some embodiments, because additional second tolerance contacts (not shown) are contemplated, then consequentially additional corresponding second vias (not shown) are contemplated. Because the additional second vias are contemplated, then additional corresponding second metallization segments (not shown) in M(i) are contemplated as being overlaid onto a first set of additional second vias (again, not shown). Also, because the additional second vias are contemplated, then additional corresponding third metallization segments (not shown) in M(i) are contemplated as being overlaid onto an additional second set of second vias (again, not shown).

In some embodiments, some segments of metallization layer M(i) supply operational voltages, e.g., VDD and VSS, and are referred to as rails. In some embodiments, the second metallization segments in M(i) (corresponding to patterns 146A, 146C, 146F and 146H) are rails that supply VDD. In some embodiments, the third metallization segments in M(i) (corresponding to patterns 148B, 148D, 148E and 148G) are rails that supply VDD. In some embodiments, the first metallization segments in M(i) (corresponding to patterns 144A-144H) are rails that supply VSS.

FIGS. 2A-2F are cross-sections of first portions 200A-200F of semiconductor devices which include ECO base cells 108A corresponding to FIGS. 1C, 1E, 1G, 1I, 1K and 1L, in accordance with some embodiments. FIGS. 3A-3F are cross-sections of second portions 300A-300F of the semiconductor devices which include ECO base cells 108A corresponding to FIGS. 1C, 1E, 1G, 1I, 1K and 1L, in accordance with some embodiments.

Figure 3B:
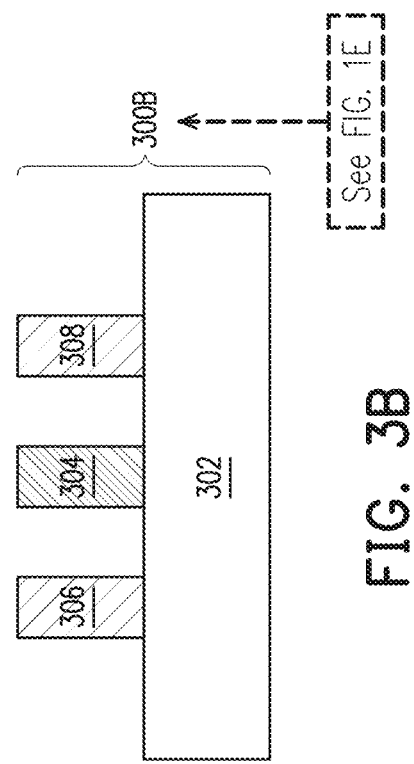
Figure 2B:
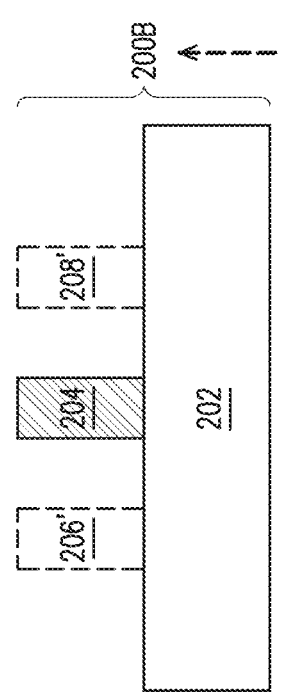

FIG. 2A corresponds to FIG. 3A. Similarly, FIGS. 2B-2F correspond to FIGS. 3B-3F. As such, FIGS. 2A-2F and 3A-3F will be discussed in pairs, beginning with FIGS. 2A and 3A, then 2B and 3B, and so on.

The pair of FIGS. 2A and 3A relate to FIG. 1C. In FIG. 2A, a gate structure 204 (corresponding to pattern 114A of FIG. 1C) and source/drain structures 206 and 208 (corresponding to patterns 116A and 118A of FIG. 1C) are formed on a substrate 202.

Similarly, in FIG. 3A, a gate structure 304 (corresponding to pattern 114A of FIG. 1C) and source/drain structures (corresponding to patterns 116A and 118A of FIG. 1C) are formed on a substrate 302, where substrate 302 corresponds to substrate 202. In some embodiments, substrates 202 and 302 are semiconductor material. In some embodiments, substrates 202 and 302 are silicon or the like.

The pair of FIGS. 2B and 3B relate to FIG. 1E. In FIG. 2B (which follows FIG. 2A), source/drain structures 206 and 208 (see FIG. 2A) have been cut/removed according to cut-pattern 120A (see FIG. 1F). In place of now-cut source/drain structures 206 and 208, 'ghosts' 206' and 208' are shown. Ghosts 206' and 208' correspond to gaps 116A' and 118A''' in FIG. 1E. In FIG. 3B (which follows FIG. 3A), no changes have been made in FIG. 3B relative to FIG. 3A.

The pair of FIGS. 2C and 3C relate to FIG. 1G. In FIG. 2C (which follows FIG. 2B), no changes have been made in FIG. 2C relative to FIG. 2B. In FIG. 3C (which follows FIG. 3B), gate structure 304 (see FIG. 3B) has been cut/removed according to cut-pattern 124A (see FIG. 1F). In place of now-cut gate structure 304, a 'ghost' 304' is shown. Ghost 304' corresponds to gap 114A'''' of FIG. 1G.

Figure 3D:
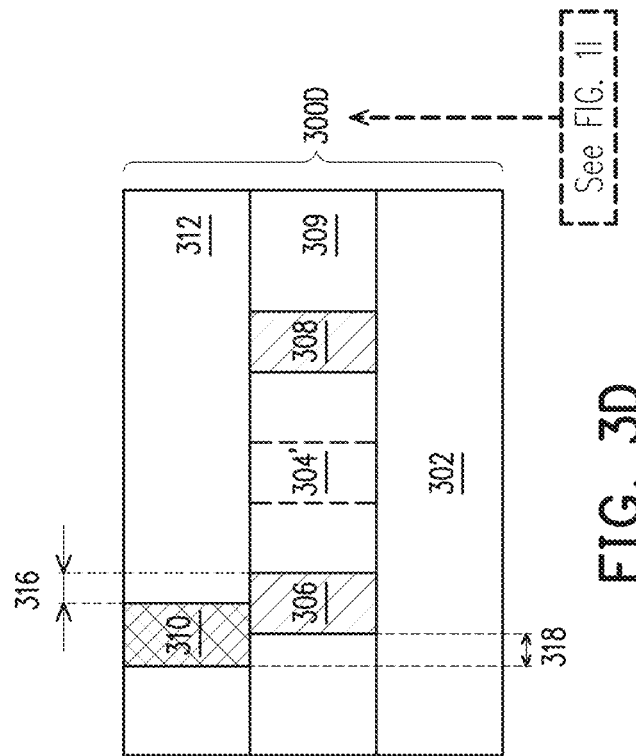
Figure 2D:
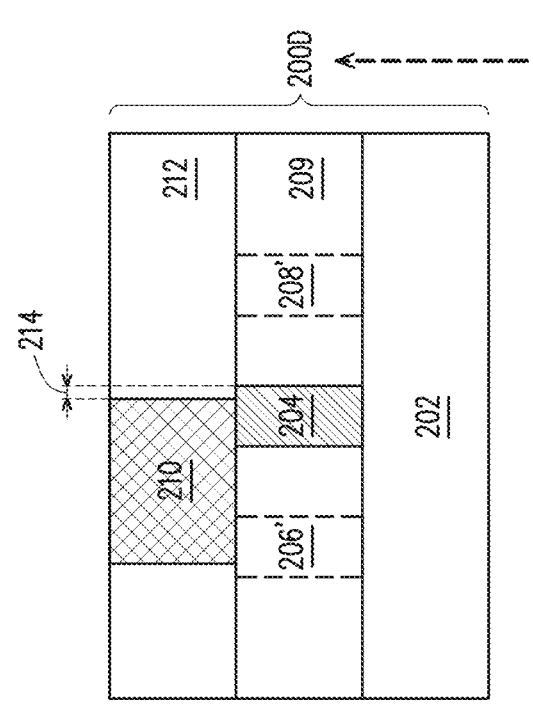

The pair of FIGS. 2D and 3D relate to FIG. 1I. In FIG. 2D (which follows FIG. 2C), an inter-layer dielectric (ILD) structure 209 is formed around gate structure 204 and on substrate 202. In some embodiments, ILD structure 209 is silicon nitride, $Si_3N_4$ or the like. A first tolerance contact 210 (corresponding to pattern 128A of FIG. 1I) is formed on gate structure 204 and on ILD structure 209. First tolerance contact 210 extends sufficiently far to overlap ghost 206'. First tolerance contact 210 does not completely overlap gate structure 204 such that a width-margin 214 of gate structure 204 remains uncovered by first tolerance contact 210. In some embodiments, width-margin 214 represents about 12.5% of the entire width of gate structure 204. Another ILD structure 212 is formed around first tolerance contact 210 and on ILD structure 209. In some embodiments, ILD structure 212 is silicon nitride, $Si_3N_4$ or the like.

In FIG. 3D (which follows FIG. 3C), an ILD structure 309 is formed around drain/source structures 306 and 308. ILD structure 309 corresponds to ILD structure 209. A second tolerance contact 310 (corresponding to pattern 129A of FIG. 1I) is formed on drain/source structure 306 and on ILD structure 209. In some embodiments, second tolerance contact 310 is substantially the same width as drain/source structure 306. In some embodiments, second tolerance structure 310 is aligned to overlap substantially half of drain/source structure 306, which leaves a width-margin 316 of drain/source structure 306 uncovered by second tolerance contact 310, and a width-margin 318 of second tolerance contact 310 covering ILD structure 309. Another ILD structure 312 is formed around second tolerance contact 310 and on ILD structure 309. ILD structure 312 corresponds to ILD structure 212.

Regarding the pair of FIGS. 2E and 3E, in FIG. 2E (which follows FIG. 2D), a first via 220 (corresponding to pattern 130A) is formed on first tolerance contact 210. First via 220 is smaller than first tolerance contact 210, hence a width-margin 224 and a width-margin 226 of first tolerance contact 210 remain uncovered on corresponding right and left sides of first via 220. In some embodiments, width-margin 224 represents about 41% of the entire width of first tolerance contact 210. In some embodiments, width-margin 226 represents about 41% of the entire width of first tolerance contact 210.

In FIG. 3E, a second via 320 (corresponding to pattern 142A) is formed on second tolerance contact 310. Second via 320 is smaller than second tolerance contact 310, hence a width-margin 328 and a width-margin 33 of second tolerance contact 310 remain uncovered on corresponding right and left sides of second via 320. In some embodiments, width-margin 328 represents about 25% of the entire width of second tolerance contact 310. In some embodiments, width-margin 33 represents about 25% of the entire width of second tolerance contact 310.

Figure 3F:
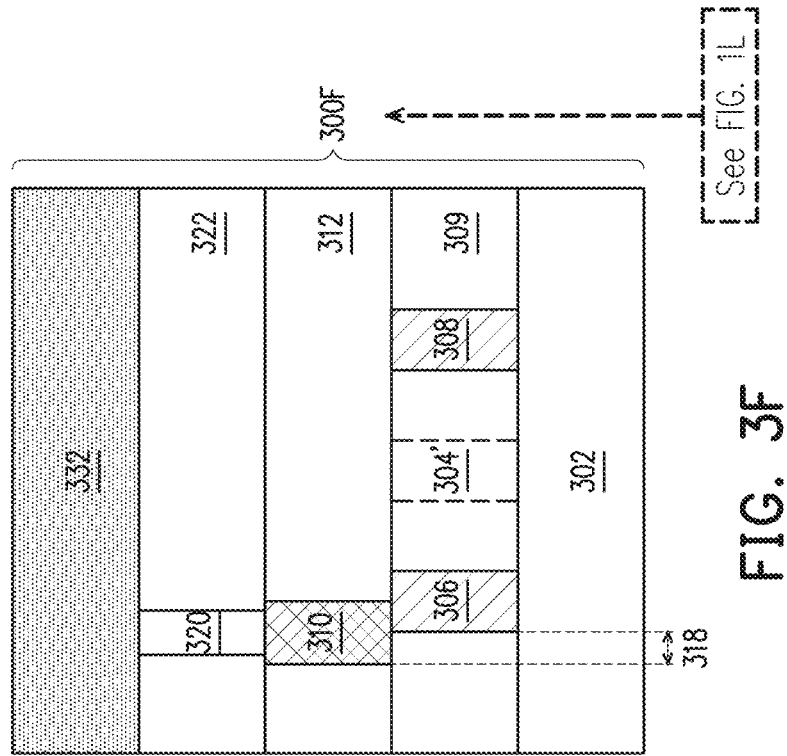
Figure 2F:
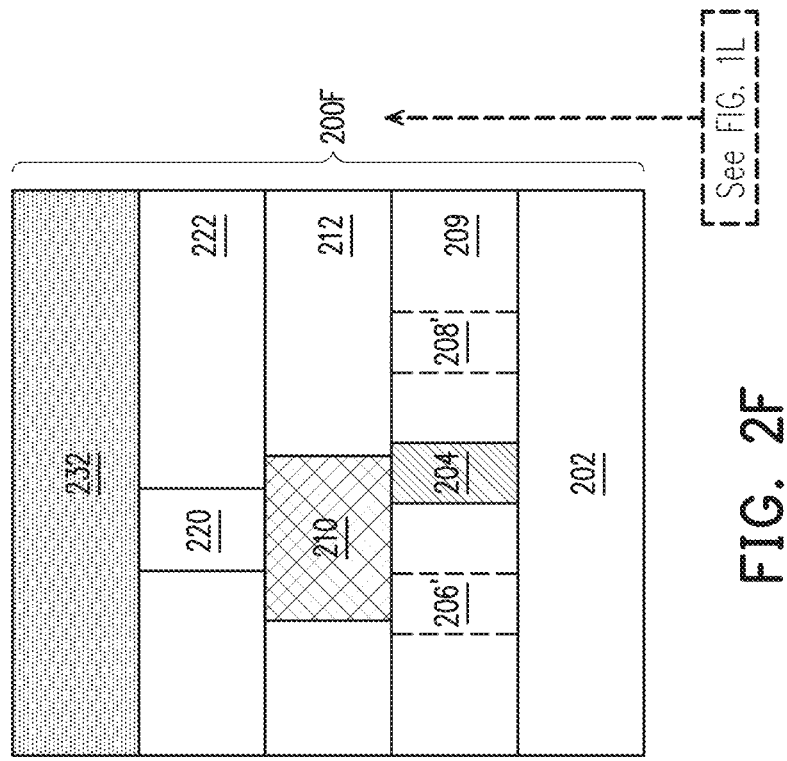

Regarding the pair of FIGS. 2F and 3F, in FIG. 2F (which follows FIG. 2E), a segment 232 of metallization layer M(i) is formed on first via 220 and ILD 222. Similarly, in FIG. 3F, a segment 332 of metallization layer M(i) is formed on second via 320 and ILD 322.

It is to be recalled that tolerance contacts are a variation an M0PO contact. Additional details regarding the structure and manufacture of M0PO contacts, as well as the similar type of inter-layer connection structure known as a metal-zero-over-oxide (MOOD or MD) contact, are disclosed in commonly assigned U.S. patent application Ser. No. 13/965,648, filed Aug. 13, 2013, having Pre-Grant Publication No. U.S. 2015/0048424 A1, and in commonly assigned U.S. patent application Ser. No. 13/939,201, filed Jul. 11, 2013, having Pre-Grant Publication No. U.S. 2015/0015335 A1, the entireties of each of which are hereby incorporated by reference.

Figure 4A:
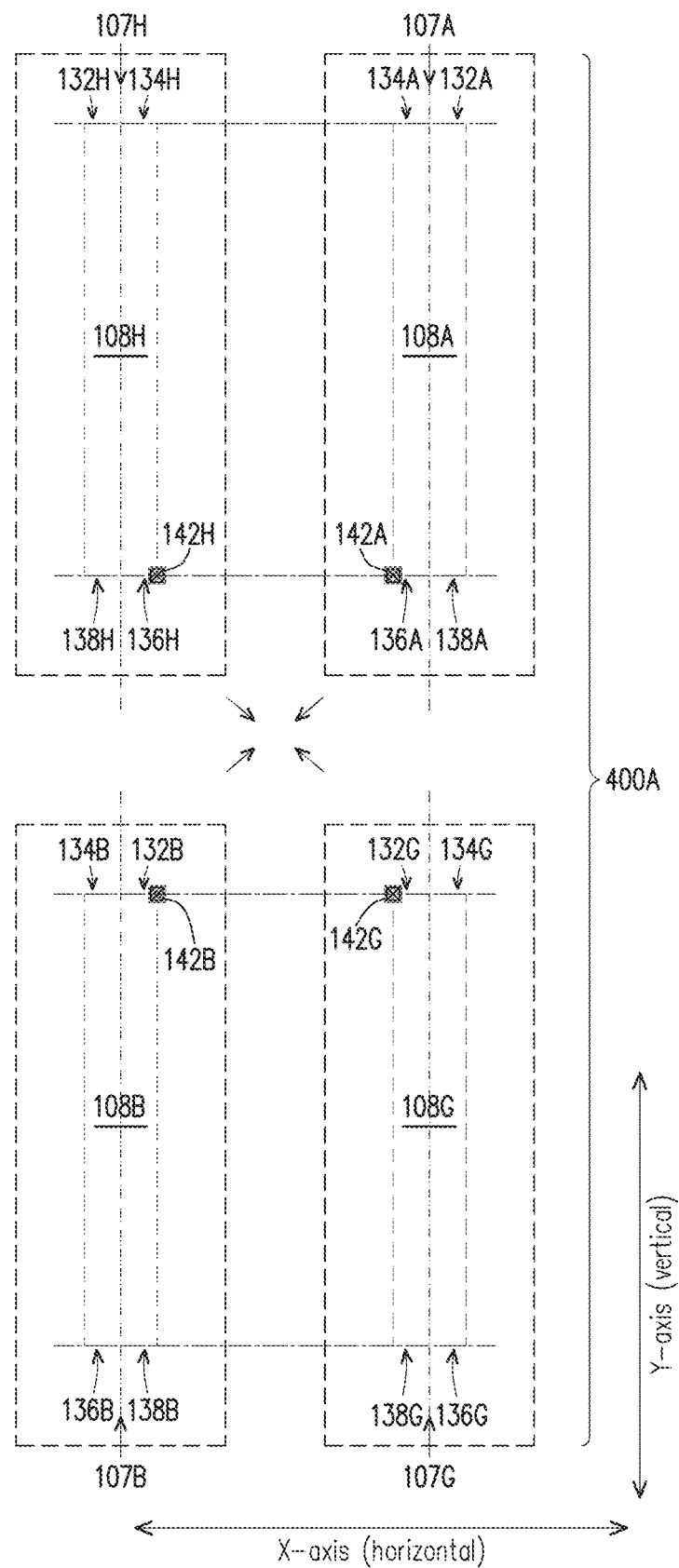
FIG. 4A is a simplified version of a layout, in accordance with some embodiments.
Figure 4B:
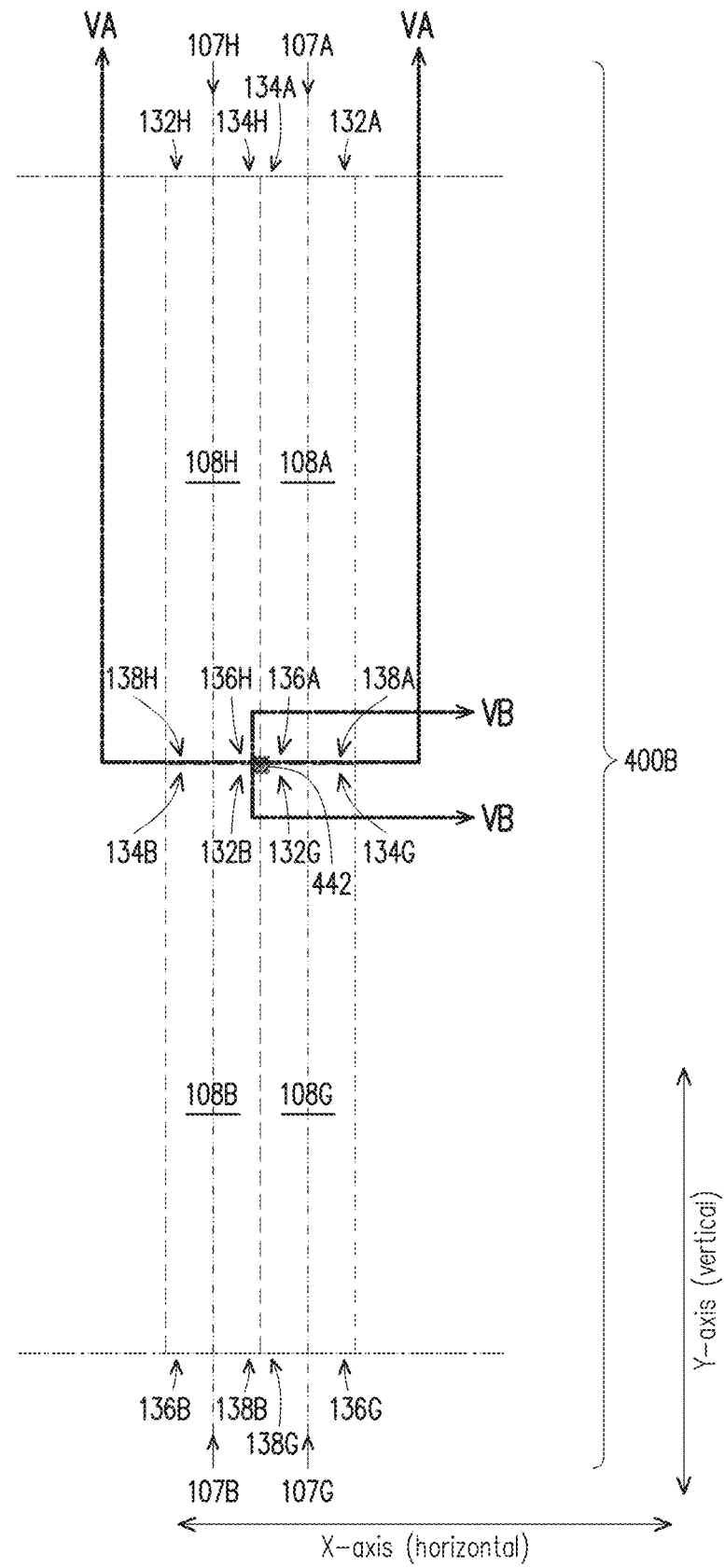
FIG. 4B is a simplified version of a layout corresponding to the layout of FIG. 4A, in accordance with some embodiments.
Figure 4C:
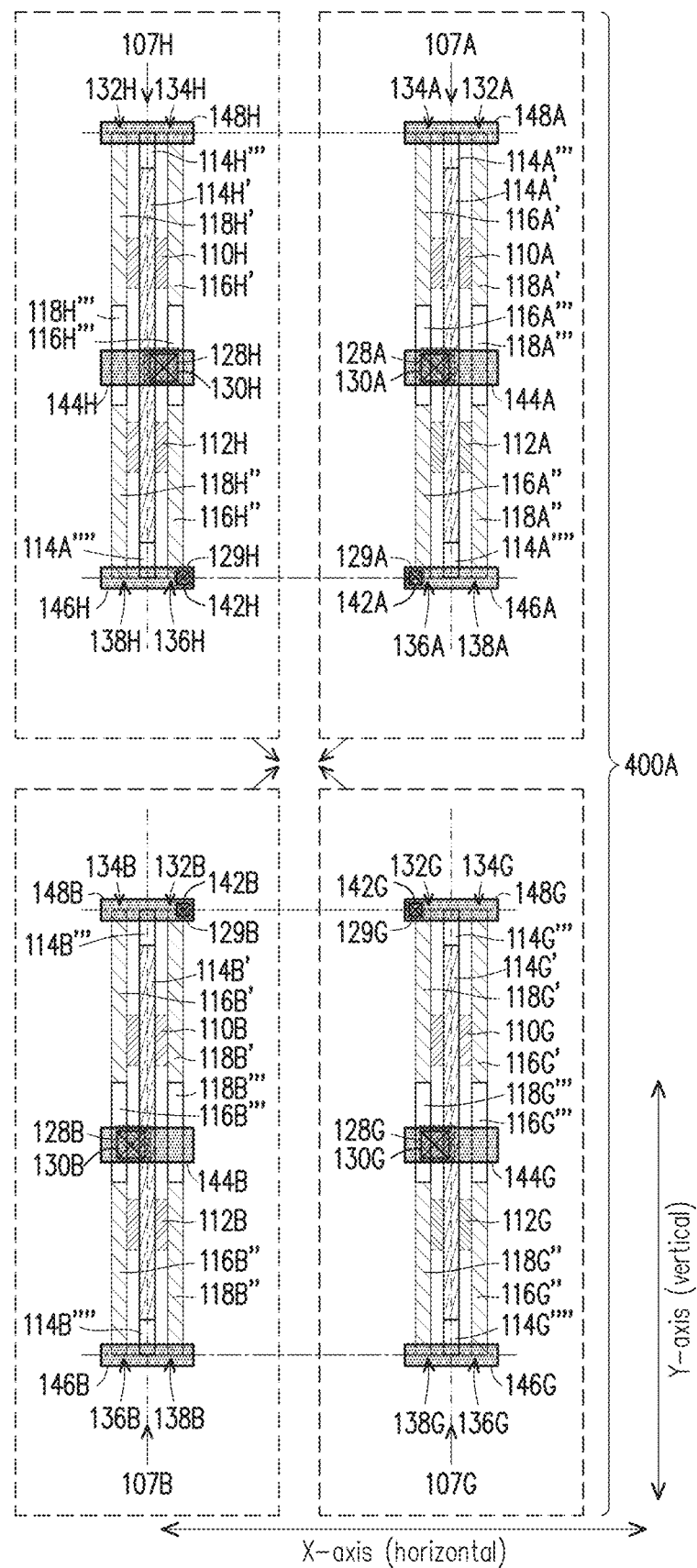
FIG. 4C is a more complex version of the layout of FIG. 4A, in accordance with some embodiments.
Figure 4D:
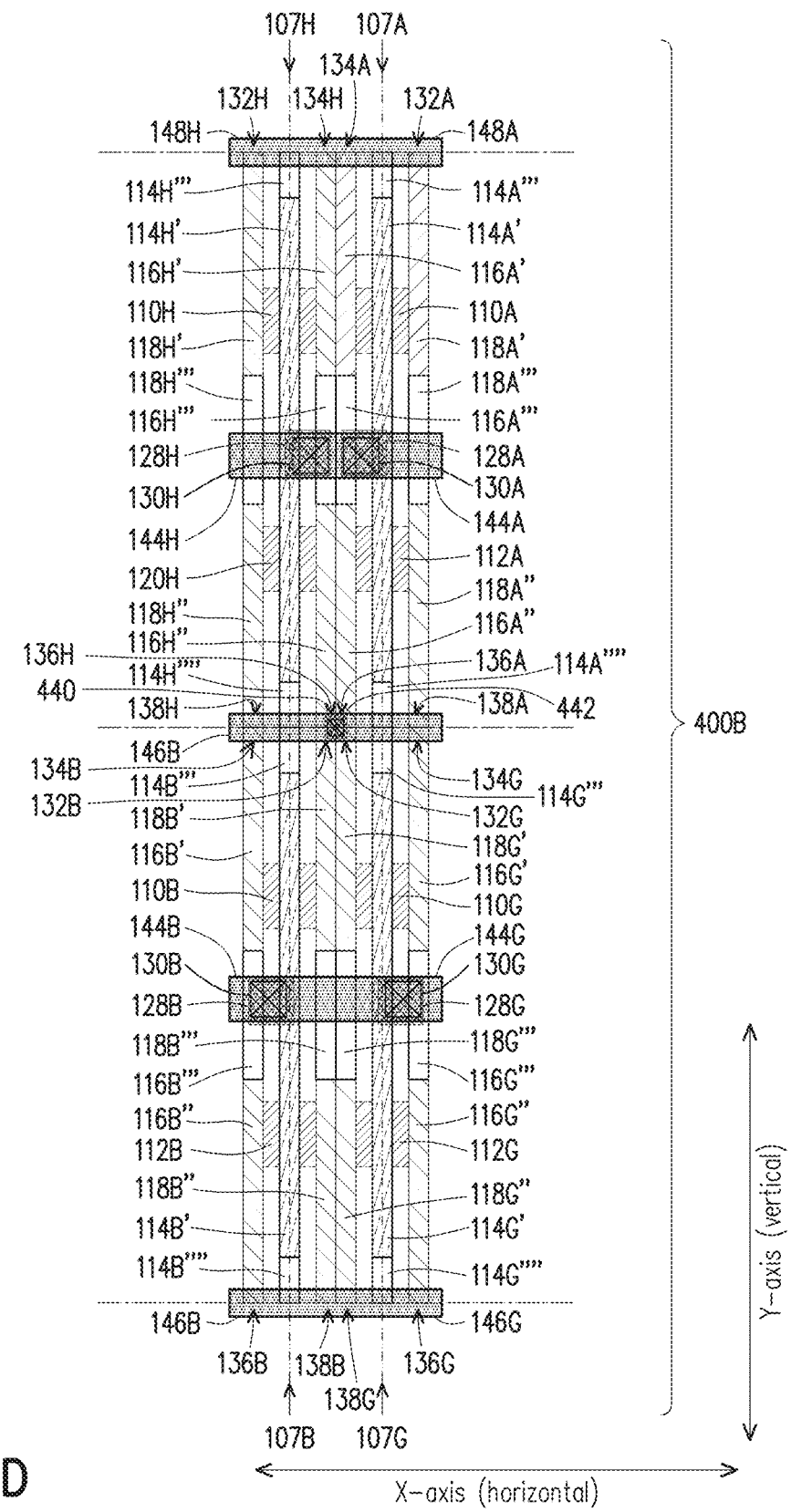
FIG. 4D is a more complex version of the layout of FIG. 4C, in accordance with some embodiments.

FIG. 4A is a simplified version of a layout 400A, in accordance with some embodiments. FIG. 4B is a simplified version of a corresponding layout 400B, in accordance with some embodiments. FIG. 4C is a more complex version of layout 400A, in accordance with some embodiments. FIG. 4D is a more complex version of layout 400B, in accordance with some embodiments.

Together, FIGS. 4A-4D show how corners of ECO base cells 108A, 108H, 108B and 108G are overlapped so as to share one second tolerance contact 440, one second via 442 and one segment 446 in metallization layer M(i). FIGS. 4A and 4C show ECO base cells 108A, 108H, 108B and 108G albeit BEFORE the corners of ECO base cells 108A, 108H, 108B and 108G have been overlapped. FIGS. 4A and 4D show ECO base cells 108A, 108H, 108B and 108G AFTER the corners of ECO base cells 108A, 108H, 108B and 108G have been overlapped. More particularly, in each of FIGS. 4A and 4C, ECO base cells 108A, 108H, 108B and 108G are shown as being arranged to be located in close proximity to each other. Accordingly, outward corners of corresponding ends 136A, 138H, 132B and 134G of drain/source structures corresponding to patterns 116A", 116H", 118B' and 118G' will correspondingly abut. As a result, as shown in each of FIGS. 4B and 4D, outward corners of corresponding ends 136A, 138H, 132B and 134G of drain/source structures corresponding to patterns 116A", 116H", 118B' and 118G' can share one second tolerance contact 440, one second via 442 and one segment 446 in metallization layer M(i).

Figure 5A:
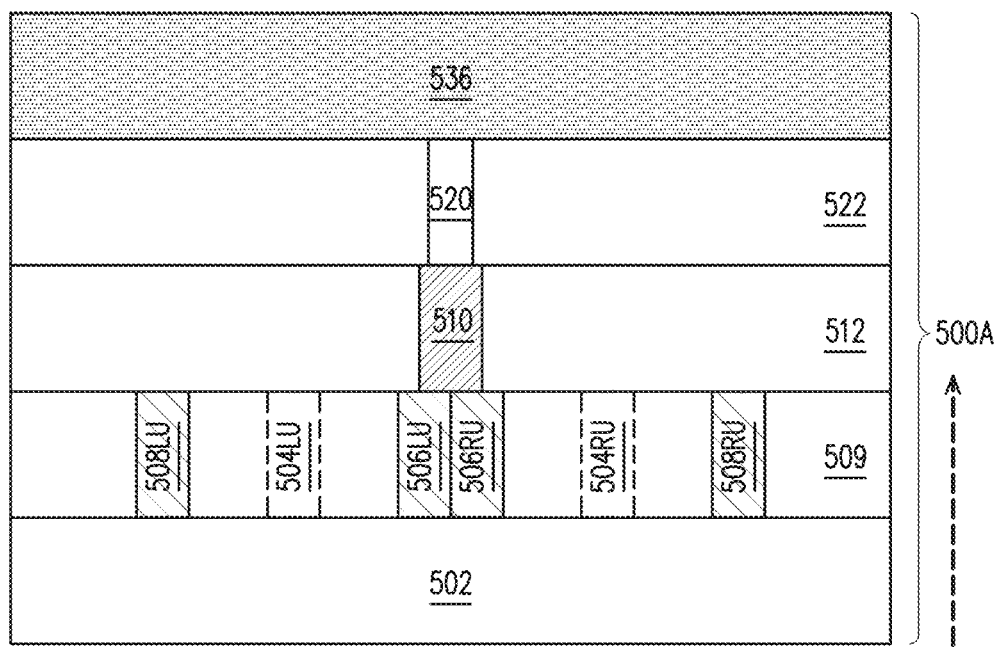
FIG. 5A is a cross-section of a first portion of the layout included in a semiconductor device, in accordance with some embodiments.
Figure 5B:
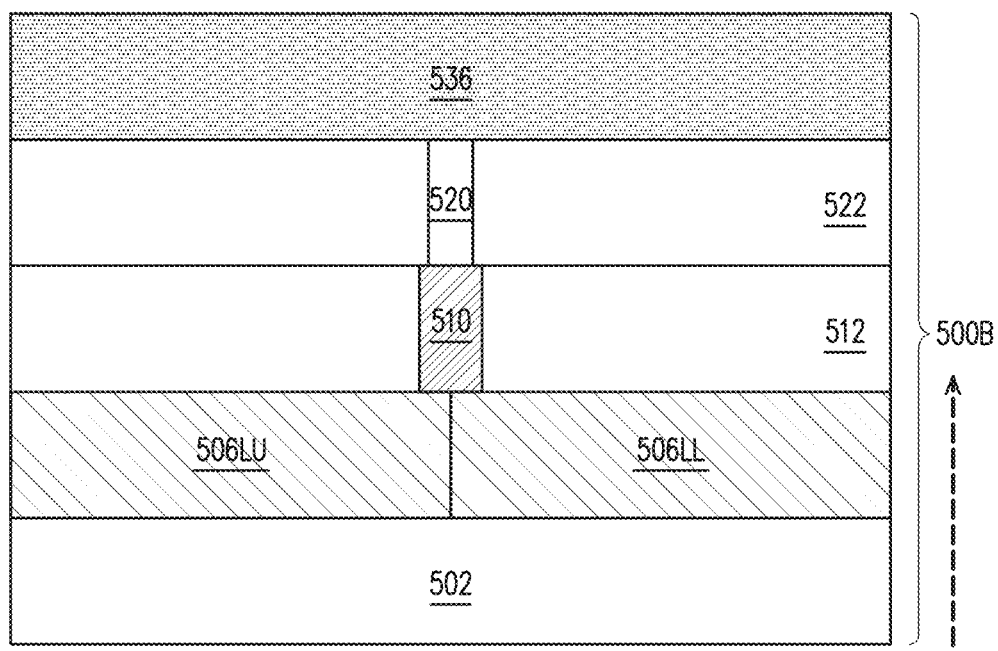
FIG. 5B is a cross-section of a second portion of the layout included in the semiconductor device, in accordance with some embodiments.

FIG. 5A is a cross-section of a first portion of layout 400B included in a semiconductor device, in accordance with some embodiments, the cross-section of FIG. 5A corresponding to ECO base cells 108A and 108H of FIG. 4B. FIG. 5B is a cross-section of a second portion of layout 400B included in the semiconductor device, in accordance with some embodiments, the cross-section of FIG. 5B corresponding to ECO base cells 108B and 108G of FIG. 4B.

In FIGS. 5A-5B, source/drain structures 508LU, 506LU, 506RU and 508RU are formed on a substrate 502 and correspond to patterns 118H", 116H", 116A" and 118A" of FIG. 4B. The suffix 'LU' denotes 'left upper' and the suffix RU denotes 'right upper.' An ILD structure 509 is formed around source/drain structures 508LU, 506LU, 506RU and 508RU and on substrate 502. In FIG. 5A but not in FIG. 5B, ghosts 504LU and 504RU of formerly-present gate structures corresponding to patterns 114H and 114A are shown in ILD structure 309.

A second tolerance contact 510 is formed on source/drain structures 506LU and 506RU such that source/drain structures 506LU and 506RU share second tolerance contact 510. An ILD structure 512 is formed around second tolerance contact 510 and on ILD structure 512. A second via 520 is formed on second tolerance contact 510 such that source/drain structures 506LU and 506RU share second via 520 indirectly through second tolerance contact 510. An ILD structure 522 is formed around second via 520 and on ILD structure 512. A segment 536 of metallization layer M(i) is formed on second via 520 and on ILD structure 522.

FIGS. 6A-6F are corresponding flowcharts 600A-600E of methods of generating a layout of an ECO base cell, in accordance with some embodiments.

Figure 6A:
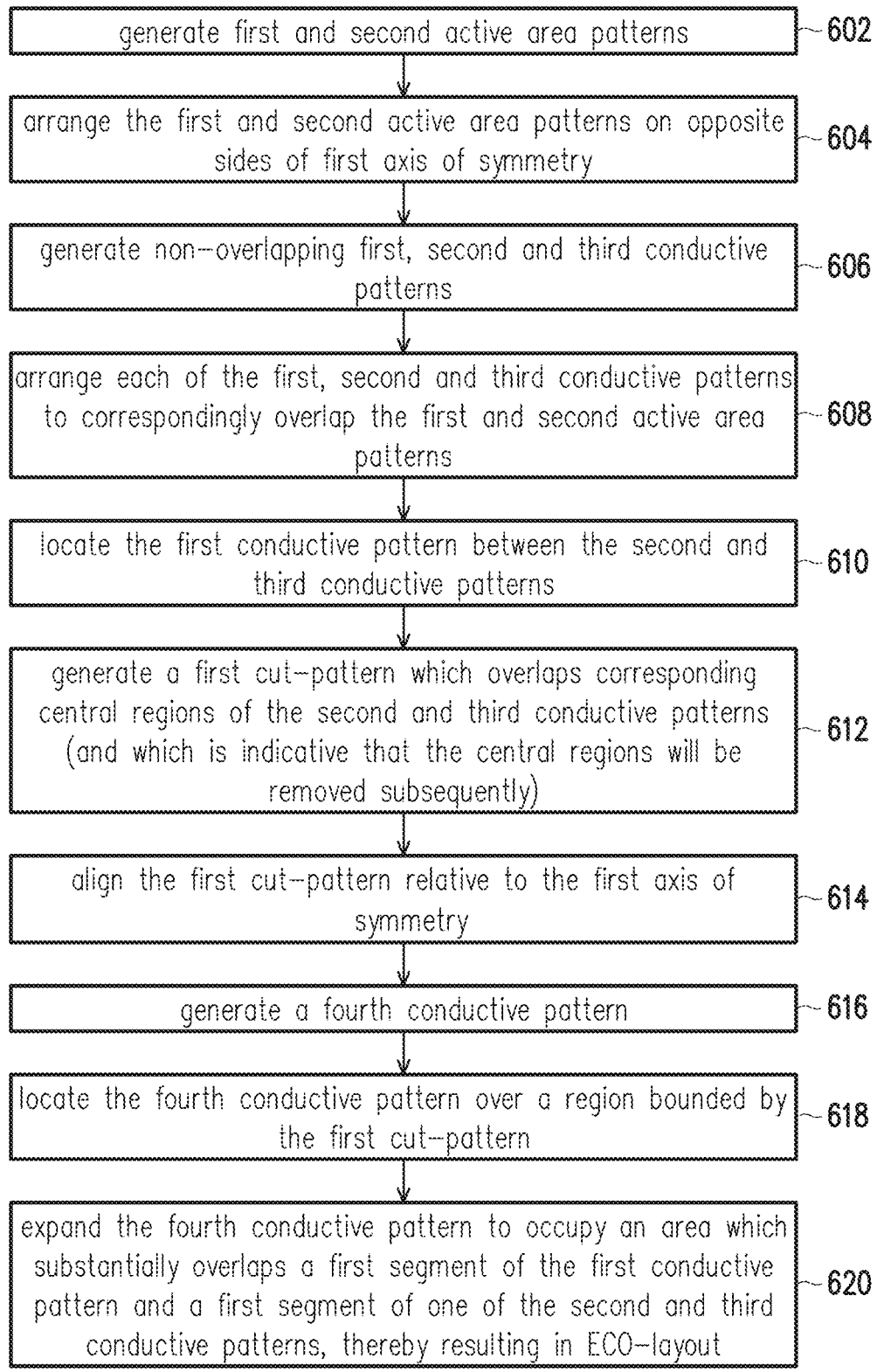

In FIG. 6A, at a block 602, first and second active area patterns corresponding, e.g., to patterns 110A and 112A (active areas) or ECO base cell 108A of FIG. 1B, are generated. From block 602, flow proceeds to a block 604. At block 604, the first and second active area patterns are arranged (in a second direction) on opposite sides of a first axis (the first axis being parallel to a first direction, the first direction being perpendicular to the second direction), e.g., the first direction is parallel to horizontal first axis 105 of FIG. 1B. From block 604, flow proceeds to a block 606. At block 606, non-overlapping first, second and third conductive patterns corresponding, e.g., patterns 114A, 116A and 118A of ECO base cell 108A of FIG. 1C, are generated. From block 606, flow proceeds to a block 608. At block 608, each of the first, second and third conductive patterns is arranged to correspondingly overlap the first and second active area patterns. From block 608, flow proceeds to a block 610.

At block 610, the first conductive pattern is located, e.g., centered, between the second and third conductive patterns. From block 610, flow proceeds to a block 612. At block 612, a first cut-pattern which overlaps corresponding central regions of the second, and third conductive patterns is generated. The first cut-pattern corresponds, e.g., to cut-pattern 120A of FIG. 1D, and is indicative that the central regions will be removed subsequently. From block 6120, flow proceeds to a block 614. At block 614, the first cut-pattern is aligned relative to, e.g., centered on, the first axis of symmetry. From block 614, flow proceeds to a block 616.

At block 616, a fourth conductive pattern is generated. The fourth conductive pattern corresponds, e.g., to pattern 128A of FIG. 1H. From block 616, flow proceeds to a block 618. At block 618, the fourth conductive pattern is located over an area bounded by the first cut-pattern. From block 618, flow proceeds to a block 620. At block 620, the fourth conductive pattern is expanded to occupy an area which substantially overlaps a first segment of the first conductive pattern (corresponding to, e.g., pattern 114A of FIG. 1H) and a first segment of one of the second (corresponding to, e.g., pattern 116A of FIG. 1H) and third (corresponding to, e.g., pattern 118A of FIG. 1H) conductive patterns. A result of block 620 is an ECO-layout of an ECO base cell. From block 620, flow proceeds to a block 622 in FIG. 6B.

Figure 6B:
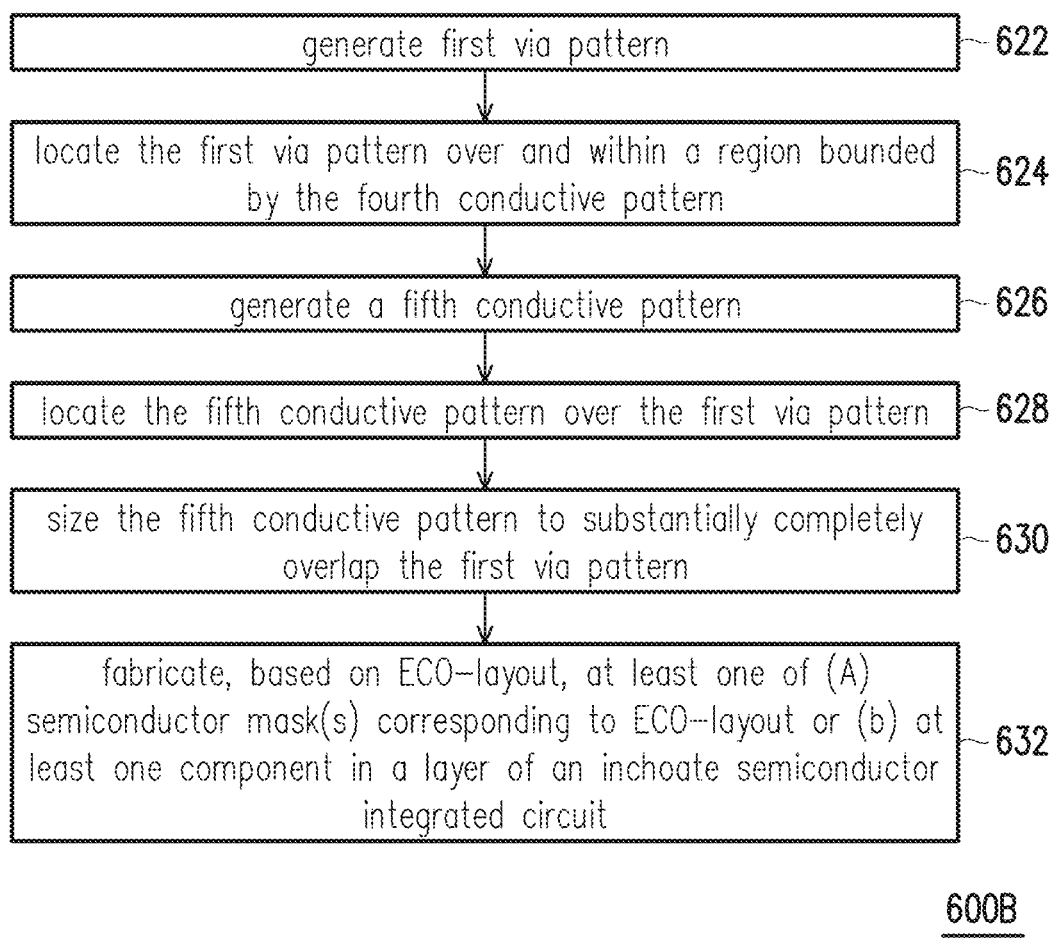

In FIG. 6B, at block 622, a first via pattern (corresponding, e.g., to pattern 130A in FIG. 1J) is generated. From block 622, flow proceeds to a block 624. At block 624, the first via pattern is located over and within a region bounded by the fourth conductive pattern (e.g., corresponding to pattern 128A of FIG. 1J). Flow proceeds from block 624 to a block 626. At block 626, a fifth conductive pattern (e.g., corresponding to pattern 144A of FIG. 1L) is generated. From block 626, flow proceeds to a block 528. At block 628, the fifth conductive pattern is located over the first via pattern. From block 628, flow proceeds to a block 630. At block 630, the fifth conductive pattern is sized so that the fifth conductive pattern substantially completely overlaps the first via pattern. A result of block 630 is a revision to the ECO-layout. From block 630, flow proceeds to a block 632. At block 632, at least one of (A) one or more semiconductor masks corresponding to the ECO-layout or (b) at least one component in a layer of an inchoate semiconductor integrated circuit is fabricated based on the ECO-layout.

Figure 6C:
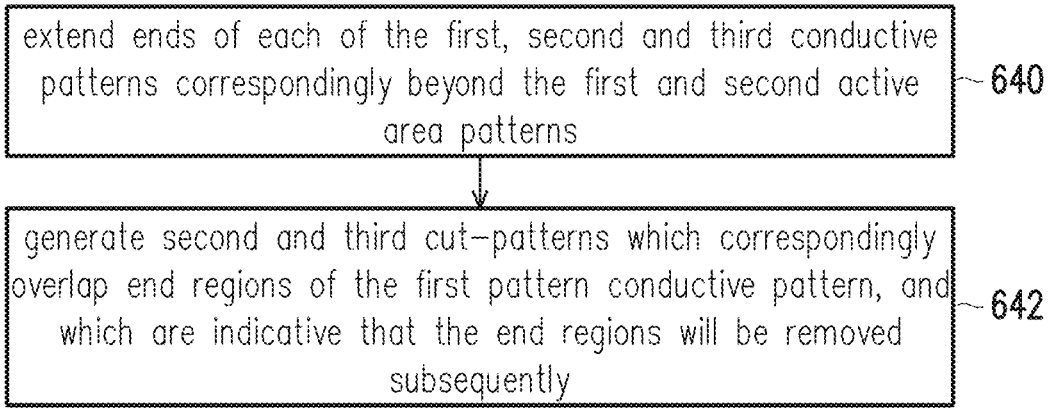

In FIG. 6C, a block 640 relates at least in part, e.g., to block 608 of FIG. 6A. At block 640, ends of each of the first, second and third conductive patterns (e.g., patterns 114A, 116A and 118A of ECO base cell 108A of FIG. 1F) are extended in the second direction (which is perpendicular to the first direction, e.g., the first direction being parallel to horizontal first axis 105 of FIG. 1B) correspondingly beyond the first and second active area patterns away from the first axis of symmetry. From block 640, flow proceeds a block 642. At block 642, second and third cut-patterns (e.g., cut-patterns 122A and 124A of FIG. 1F) are generated which correspondingly overlap end regions of the first conductive pattern, and which are indicative that the end regions the first conductive pattern will be removed subsequently. A result of block 642 is a revision to the ECO-layout.

Figure 6D:
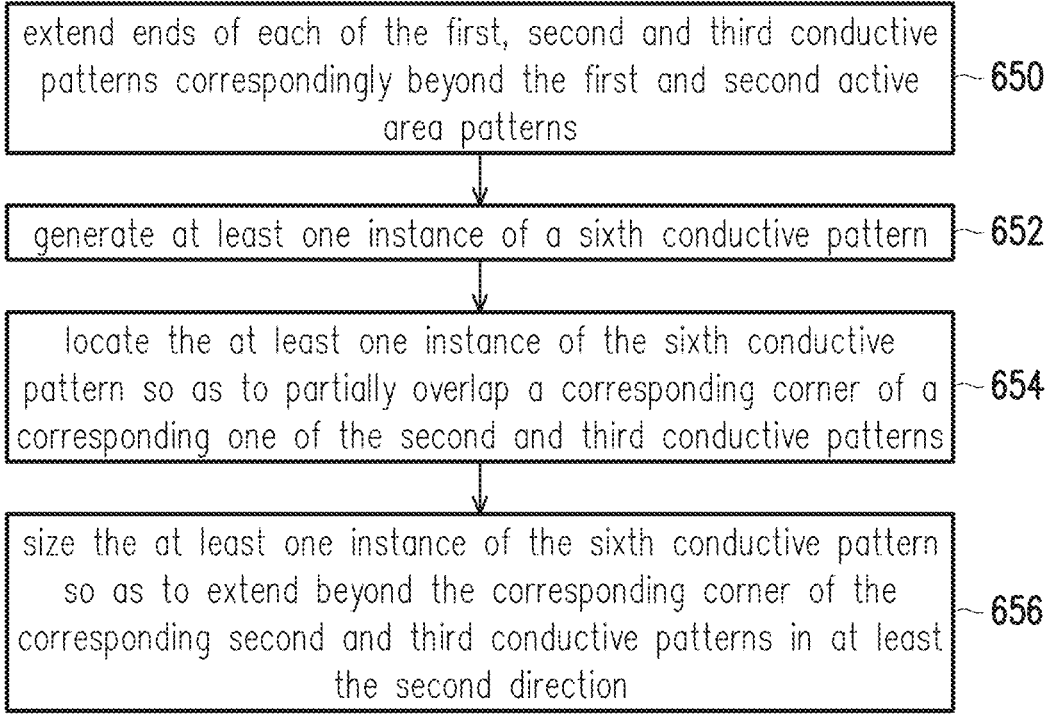

In FIG. 6D, a block 650 relates at least in part, e.g., to block 640 of FIG. 6A. At block 650, ends of each of the first, second and third conductive patterns (e.g., patterns 114A, 116A and 118A of ECO base cell 108A of FIG. 1K) are extended in the second direction correspondingly beyond the first and second active area patterns away from the first axis of symmetry. From block 650, flow proceeds to a block 652. At block 652, at least one instance of a fifth conductive pattern (e.g., an instance of second via corresponding to pattern 142A of FIG. 1K) is generated. From block 652, flow proceeds to a block 654. At block 654, the at least one instance of the fifth conductive pattern is located so as to partially overlap a corresponding corner of the corresponding end of a corresponding one (e.g., outward corner of end 136A in FIG. 1K) of the second and third conductive patterns. A result of block 654 is a revision to the ECO-layout. From block 654, flow proceeds to a block 656. At block 656, the at least one instance of the fifth conductive pattern is sized so as to extend beyond the corresponding corner of the corresponding end of the corresponding one of the second and third conductive patterns in at least the second direction (see, e.g., tolerance contact 310 in FIG. 3E). A result of block 656 is a revision to the ECO-layout.

In FIG. 6E, a block 660 relates, e.g., to block 618. At block 660, the fourth conductive pattern (e.g., to pattern 128C of FIG. 1H) is located asymmetrically about the first axis (e.g., horizontal first axis 105). A result of block 660 is a revision to the ECO-layout.

In FIG. 6F, a block 670 relates, e.g., to block 618 or block 660. At block 670, a second cut-pattern (e.g., corresponding to cut-pattern 126A of FIG. 1H) is generated, the second cut-pattern correspondingly overlapping a second segment of the first conductive pattern (e.g., corresponding to pattern 114C. The second cut-pattern is indicative that the second segment of the first conductive pattern will be removed subsequently. From block 670, flow proceeds to a block 672. At block 672, the second cut-pattern is located asymmetrically relative to the first axis (e.g., horizontal first axis 105 of FIG. 1H). A result of block 672 is a revision to the ECO-layout.

Figure 7:
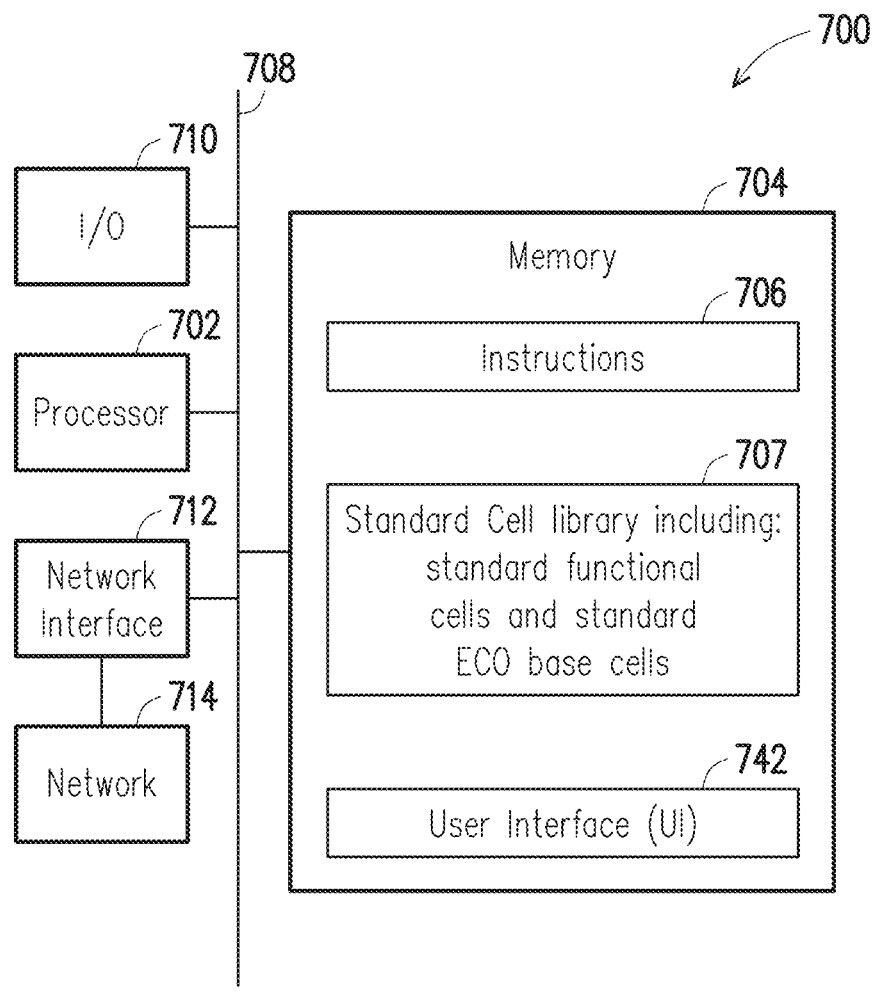
FIG. 7 is a block diagram of a computer system, in accordance with some embodiments.

FIG. 7 is a block diagram of an electronic design automation (EDA) system 700 in accordance with some embodiments.

The method of flowcharts 600A-600B of FIGS. 6A-6B are implemented, for example, using EDA system 700, in accordance with some embodiments.

In some embodiments, EDA system 700 is a general purpose computing device including a hardware processor 702 and a non-transitory, computer-readable storage medium 704. Computer-readable storage medium 704, amongst other things, is encoded with, i.e., stores, computer program code 706, i.e., a set of executable instructions. Execution of computer program code 706 (instructions) by processor 702 represents (at least in part) an EDA tool which implements a portion or all of, e.g., the method of generating a layout of an ECO base cell, e.g., in the method of FIG. 6A-6B, in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause EDA system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause EDA system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores library 707 of standard cells including standard functional cells and standard ECO base cells.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable storage medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells plus ECO base cells and/or ECO programmed cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, or the like.

Figure 8:
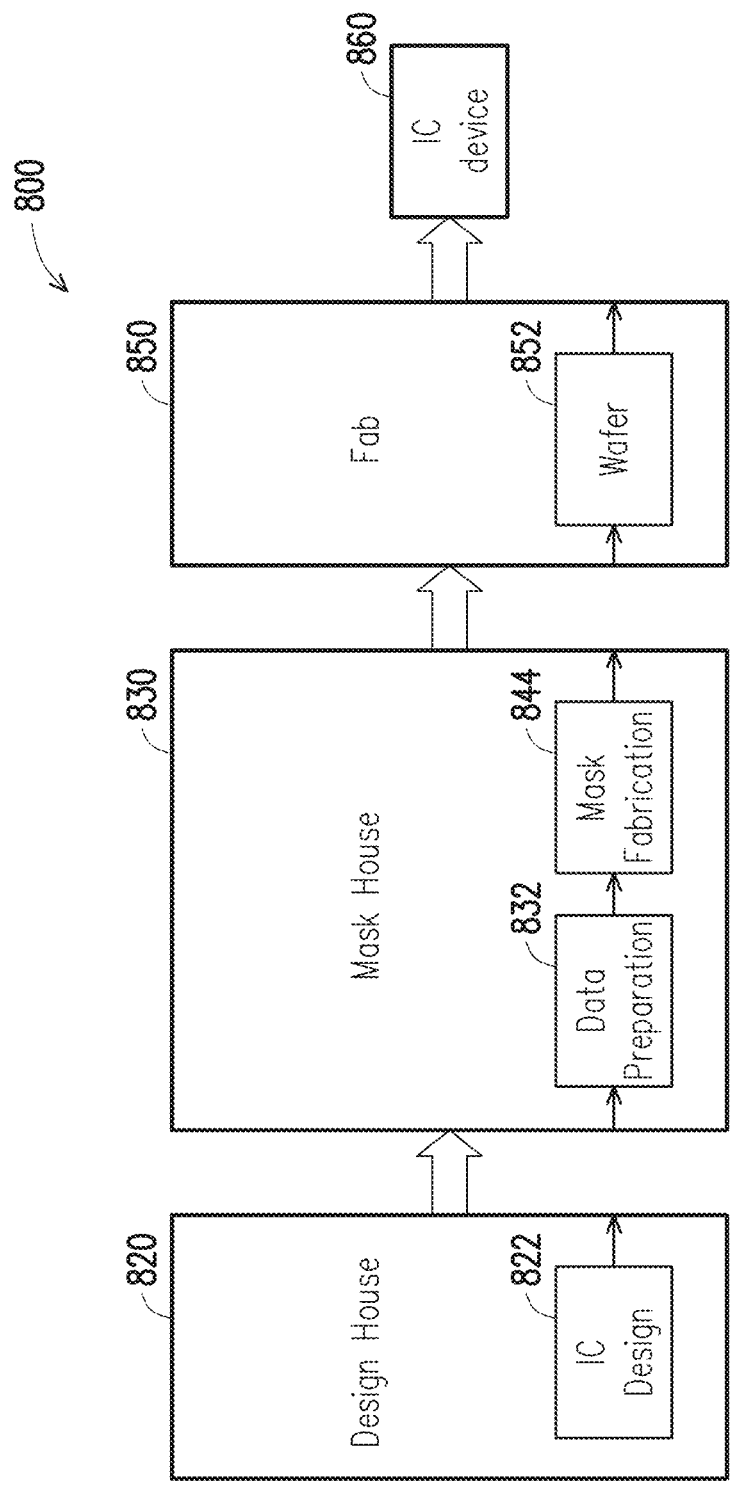
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

In general, IC manufacturing system 800 generates a layout (e.g., any one of layouts 100A-100L of corresponding FIG. 1A-1L, or the like). Based on the layout, IC manufacturing system 800 fabricates at least one of (A) one or more semiconductor masks or (b) at least one component in a layer of an inchoate semiconductor integrated circuit.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in IC manufacturing system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 can be expressed in a GDSII file format or DFII file format.

Mask house 830 includes mask data preparation 832 and mask fabrication 844. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects or the like. OPC adjusts IC design layout 822. In some embodiments, mask data preparation 832 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design layout 822.

It should be understood that the above description of mask data preparation 832 has been simplified for the purposes of clarity. In some embodiments, mask data preparation 832 includes additional features such as a logic operation (LOP) to modify the IC design layout according to manufacturing rules. Additionally, the processes applied to IC design layout 822 during mask data preparation 832 may be executed in a variety of different orders.

After mask data preparation 832 and during mask fabrication 844, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in the semiconductor wafer, in an etching process to form various etching regions in the semiconductor wafer, and/or in other suitable processes.

IC fab 850 is an IC fabrication business that includes one or more manufacturing facilities for the fabrication of a variety of different IC products. In some embodiments, IC fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses the mask (or masks) fabricated by mask house 830 to fabricate IC device 860. Thus, IC fab 850 at least indirectly uses IC design layout 822 to fabricate IC device 860. In some embodiments, a semiconductor wafer 852 is fabricated by IC fab 850 using the mask (or masks) to form IC device 860. Semiconductor wafer 852 includes a silicon substrate or other proper substrate having material layers formed thereon. Semiconductor wafer further includes one or more of various doped regions, dielectric features, multilevel interconnects, or the like (formed at subsequent manufacturing steps).

Details regarding an integrated circuit (IC) manufacturing system (e.g., IC manufacturing system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In general, assuming (again) that the long axes of the metallization segments are parallel to the horizontal axis, a way to reduce the overall height (in the vertical direction) of the standard cell is to reduce the vertical size of metallization segments. In some embodiments, cell-height reduction is achieved with one or more instances of a first tolerance contact (e.g., 210). In some embodiments, cell-height reduction is achieved with one or more instances of a second tolerance contact (e.g., 310). In some embodiments, cell-height reduction is achieved with one or more instances of the first tolerance contact and one or more instances of the second tolerance contact. When the metallization segments are reduced in the vertical direction, the overall height of the standard cell is reduced and the density of a semiconductor device built using such standard cells increases. In some embodiments, the density improves by a range of about 13% to about 20%.

More particularly, the first tolerance contact is inserted between a first conductive structure (e.g., gate structure 204) and a first via (e.g., via 220). For a situation in which the first via would be formed directly on the first conductive structure, the alignment-tolerance between the first via and the first conductive structure is disadvantageously reduced. In contrast, by inserting the first tolerance contact between the first conductive structure and the first via, alignment-tolerance is increased. By using the first tolerance contact as an agent by which alignment-tolerance is advantageously increased, it is not necessary to rely on increases in the vertical size of the metallization segment (which overlies the first contact) as an agent by which alignment-tolerance is increased. Instead, the vertical size of the metallization segment (which overlies the first contact) can be reduced, which consequently (and beneficially) reduces the vertical size of metallization segments (where, again, it is assumed that the long axes of the metallization segments are parallel to the horizontal axis).

Also more particularly, the second tolerance contact is inserted between a second conductive structure (e.g., drain/source structure 306) and a second via (e.g., second via 320). For a situation in which the second via would be formed directly on the second conductive structure, the alignment-tolerance between the second via and the second conductive structure is disadvantageously reduced. In contrast, by inserting the second tolerance contact between the second conductive structure and the second via, alignment-tolerance is advantageously increased. By using the second tolerance contact as an agent by which alignment-tolerance is increased, it is not necessary to rely on increases in the vertical size of the metallization segment (which overlies the second contact) as an agent by which alignment-tolerance is increased. Instead, the vertical size of the metallization segment (which overlies the second contact) can be reduced, which consequently (and beneficially) reduces the vertical size of metallization segments (where, again, it is assumed that the long axes of the metallization segments are parallel to the horizontal axis).

In some embodiments, a semiconductor device including an array of cell regions in which at least one of the cell regions includes: first and second active areas, in a semiconductor substrate, having corresponding long axes in a first direction; first, third and fifth conductive structures overlapping the first active area and having corresponding long axes in a second direction different from the first direction, the first conductive structure being between the third and fifth conductive structures; second, fourth and sixth conductive structures overlapping the second active area and having corresponding long axes in the second direction, the second conductive structure being between the fourth and sixth conductive structures, and the long axes of the first and second conductive structures being substantially collinear; and a seventh conductive structure overlapping one of the first conductive structure or the second conductive structure, the seventh conductive structure being over a first gap between the third and fourth conductive structures or a second gap between the fifth and sixth conductive structures.

In some embodiments, the semiconductor device further includes: a first via over and within a region bounded by the seventh conductive structure; and an eighth conductive structure over the first via and sized so as to substantially completely overlap the first via, the eighth conductive structure being a segment within a first metallization layer.

In some embodiments, the long axes of the first and second active areas extend parallel to, and are disposed on opposite sides of, a first axis of symmetry, and ends of the first through sixth conductive structures, in the second direction, extend correspondingly beyond the first and second active areas away from the first axis of symmetry.

In some embodiments, the ends of the third through sixth conductive structures, in the second direction, extend beyond corresponding ones of the ends of the first and second conductive structures.

In some embodiments, the semiconductor device further includes: one or more second vias; and wherein each second via partially overlaps a corresponding corner of the corresponding end of a corresponding one of the fourth conductive structure or the fifth conductive structure.

In some embodiments, each second via is sized so as to extend beyond the corresponding corner of the corresponding end of the corresponding one of the fourth conductive structure or the fifth conductive structure in at least the second direction.

In some embodiments, the first and second conductive structures, for at least one of the cell regions, represent a unitary structure.

In some embodiments, the long axes of the first and second active areas extend parallel to, and are disposed on opposite sides of, a first axis of symmetry, and a third gap asymmetrically between the first and second conductive structures relative to the first axis of symmetry.

In some embodiments, the long axes of the first and second active areas extend parallel to, and are disposed on opposite sides of, a first axis of symmetry, and the seventh conductive structure is asymmetric about the first axis of symmetry.

In some embodiments, the substantially collinear long axes of the first and second conductive structures represent a second axis of symmetry; and the seventh conductive structure is asymmetric about the second axis of symmetry.

In some embodiments, a semiconductor device including an array of cell regions in which at least one cell includes: first and second active areas, in a semiconductor substrate, having corresponding long axes in a first direction; a first conductive structure overlapping the first and second active areas and having a long axis in a second direction different from the first direction; second and fourth conductive structures overlapping the first active area and having long axes in the second direction, the first conductive structure being between the second and fourth conductive structures; third and fifth conductive structures overlapping the second active area and having long axes in the second direction, the first conductive structure being between the third and fifth conductive structures; and a sixth conductive structure overlapping the first conductive structure, the sixth conductive structure being over a first gap between the second and third conductive structures or a second gap between the fourth and fifth conductive structures.

In some embodiments, the semiconductor device further includes: a first via over and within a region bounded by the sixth conductive structure; and a seventh conductive structure over the first via and sized so as to substantially completely overlap the first via, the seventh conductive structure being a segment within a first metallization layer.

In some embodiments, the long axes of the first and second active areas extend parallel to, and are disposed on opposite sides of, a first axis of symmetry, and ends of the first through fifth conductive structures, in the second direction, extend correspondingly beyond the first and second active areas away from the first axis of symmetry.

In some embodiments, the ends of the second through fifth conductive structures, in the second direction, extend beyond the end of the first conductive structure.

In some embodiments, the semiconductor device further includes: one or more second vias; and wherein each second via partially overlaps a corresponding corner of the corresponding end of a corresponding one of the third conductive structure or the fourth conductive structure.

In some embodiments, each second via is sized so as to extend beyond the corresponding corner of the corresponding end of the corresponding one of the third conductive structure or the fourth conductive structure in at least the second direction.

In some embodiments, the long axes of the first and second active areas extend parallel to, and are disposed on opposite sides of, a first axis of symmetry, the sixth conductive structure is asymmetric about the first axis of symmetry, and the sixth conductive structure is asymmetric about the long axis of the first conductive structure.

In some embodiments, a semiconductor device includes an array of cell regions in which at least one cell includes: first and second active areas, in a semiconductor substrate, having corresponding long axes in a first direction; first, third and fifth conductive structures overlapping the first active area and having corresponding long axes in a second direction different from the first direction, the first conductive structure being between the third and fifth conductive structures; second, fourth and sixth conductive structures overlapping the second active area and having corresponding long axes in the second direction, the second conductive structure being between the fourth and sixth conductive structures, and the long axes of the first and second conductive structures being substantially collinear; and a seventh conductive structure overlapping one of the first conductive structure or the second conductive structure, the seventh conductive structure being in an area between ends of the third, fourth, fifth and sixth conductive structures.

In some embodiments, a first via over and within a region bounded by the seventh conductive structure; and an eighth conductive structure over the first via and sized so as to substantially completely overlap the first via, the eighth conductive structure being a segment within a first metallization layer.

In some embodiments, the semiconductor device further includes: one or more second vias; and wherein each second via partially overlaps a corresponding corner of a corresponding end of a corresponding one of the fourth conductive structure or the fifth conductive structure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising an array of cell regions in which at least one of the cell regions includes:
    first and second active areas, in a semiconductor substrate, having corresponding long axes in a first direction;
    first, third and fifth conductive structures overlapping the first active area and having corresponding long axes in a second direction different from the first direction,
        the first conductive structure being a first gate structure and being between the third and fifth conductive structures;
    second, fourth and sixth conductive structures overlapping the second active area and having corresponding long axes in the second direction,
        the second conductive structure being a second gate structure and being between the fourth and sixth conductive structures, and
        the long axes of the first and second conductive structures being substantially collinear; and
    a seventh conductive structure overlapping one of the first conductive structure or the second conductive structure,
        the seventh conductive structure being over a first gap between the third and fourth conductive structures or a second gap between the fifth and sixth conductive structures.

2. The semiconductor device of claim 1, further comprising:
    a first via over and within a region bounded by the seventh conductive structure; and
    an eighth conductive structure over the first via and sized so as to substantially completely overlap the first via, the eighth conductive structure being a segment within a first metallization layer.

3. The semiconductor device of claim 1, wherein:
    the long axes of the first and second active areas extend parallel to, and are disposed on opposite sides of, a first axis of symmetry, and
    ends of the first through sixth conductive structures, in the second direction, extend correspondingly beyond the first and second active areas away from the first axis of symmetry.

4. The semiconductor device of claim 3, wherein:
    the ends of the third through sixth conductive structures, in the second direction, extend beyond corresponding ones of the ends of the first and second conductive structures.

5. The semiconductor device of claim 3, further comprising:
    one or more second vias; and wherein
    each second via partially overlaps a corresponding corner of the corresponding end of a corresponding one of the fourth conductive structure or the fifth conductive structure.

6. The semiconductor device of claim 5, wherein:
    each second via is sized so as to extend beyond the corresponding corner of the corresponding end of the corresponding one of the fourth conductive structure or the fifth conductive structure in at least the second direction.

7. The semiconductor device of claim 1, wherein:
    the first and second conductive structures, for at least one of the cell regions, represent a unitary gate structure, and
    the seventh conductive structure contacts the unitary gate structure.

8. The semiconductor device of claim 1, wherein:
    the long axes of the first and second active areas extend parallel to, and are disposed on opposite sides of, a first axis of symmetry,
    a third gap is asymmetrically between the first and second conductive structures relative to the first axis of symmetry, and
    the seventh conductive structure is in contact with the one of the first conductive structure or the second conductive structure in a location proximate to the third gap.

9. The semiconductor device of claim 1, wherein:
    the long axes of the first and second active areas extend parallel to, and are disposed on opposite sides of, a first axis of symmetry, and the seventh conductive structure is asymmetric about the first axis of symmetry.

10. The semiconductor device of claim 1, wherein:
the substantially collinear long axes of the first and second conductive structures represent a second axis of symmetry; and
the seventh conductive structure is asymmetric about the second axis of symmetry.

11. A semiconductor device comprising an array of cell regions in which at least one cell includes:
first and second active areas, in a semiconductor substrate, having corresponding long axes in a first direction;
a first conductive structure overlapping the first and second active areas and having a long axis in a second direction different from the first direction;
second and fourth conductive structures overlapping the first active area and having long axes in the second direction,
the first conductive structure being between the second and fourth conductive structures;
third and fifth conductive structures overlapping the second active area and having long axes in the second direction,
the first conductive structure being a first gate structure and being between the third and fifth conductive structures; and
a sixth conductive structure overlapping the first conductive structure,
the sixth conductive structure being over a first gap between the second and third conductive structures or a second gap between the fourth and fifth conductive structures.

12. The semiconductor device of claim 11, further comprising:
a first via over and within a region bounded by the sixth conductive structure; and
a seventh conductive structure over the first via and sized so as to substantially completely overlap the first via,
the seventh conductive structure being a segment within a first metallization layer.

13. The semiconductor device of claim 11, wherein:
the long axes of the first and second active areas extend parallel to, and are disposed on opposite sides of, a first axis of symmetry, and
ends of the first through fifth conductive structures, in the second direction, extend correspondingly beyond the first and second active areas away from the first axis of symmetry.

14. The semiconductor device of claim 13, wherein:
the ends of the second through fifth conductive structures, in the second direction, extend beyond the end of the first conductive structure.

15. The semiconductor device of claim 13, further comprising:
one or more second vias; and wherein
each second via partially overlaps a corresponding corner of the corresponding end of a corresponding one of the third conductive structure or the fourth conductive structure.

16. The semiconductor device of claim 15, wherein:
each second via is sized so as to extend beyond the corresponding corner of the corresponding end of the corresponding one of the third conductive structure or the fourth conductive structure in at least the second direction.

17. The semiconductor device of claim 11, wherein:
the long axes of the first and second active areas extend parallel to, and are disposed on opposite sides of, a first axis of symmetry,
the sixth conductive structure is asymmetric about the first axis of symmetry,
the sixth conductive structure is asymmetric about the long axis of the first conductive structure, and
the sixth conductive structure is in contact with the first conductive structure.

18. A semiconductor device comprising an array of cell regions in which at least one cell includes:
first and second active areas, in a semiconductor substrate, having corresponding long axes in a first direction;
first, third and fifth conductive structures overlapping the first active area and having corresponding long axes in a second direction different from the first direction,
the first conductive structure being between the third and fifth conductive structures, and
the first conductive structure extends across an entire height, in the second direction, of the first active area;
second, fourth and sixth conductive structures overlapping the second active area and having corresponding long axes in the second direction,
the second conductive structure being between the fourth and sixth conductive structures, and
the long axes of the first and second conductive structures being substantially collinear; and
a seventh conductive structure overlapping one of the first conductive structure or the second conductive structure,
the seventh conductive structure being in an area between ends of the third, fourth, fifth and sixth conductive structures.

19. The semiconductor device of claim 18, further comprising:
a first via over and within a region bounded by the seventh conductive structure; and
an eighth conductive structure over the first via and sized so as to substantially completely overlap the first via,
the eighth conductive structure being a segment within a first metallization layer.

20. The semiconductor device of claim 18, further comprising:
one or more second vias; and wherein
each second via partially overlaps a corresponding corner of a corresponding end of a corresponding one of the fourth conductive structure or the fifth conductive structure and partially extends beyond the corresponding corner of a corresponding end of a corresponding one of the fourth conductive structure or the fifth conductive structure.

* * * * *